United States Patent
Yamaoka et al.

(10) Patent No.: US 9,966,939 B2
(45) Date of Patent: May 8, 2018

(54) CONVERTER FOR CONVERTING CODE-MODULATED POWER WITH CONVERSION CODE, POWER TRANSMISSION SYSTEM, AND CONTROLLER

(71) Applicant: Panasonic Intellectual Property Management Co., Ltd., Osaka (JP)

(72) Inventors: Masahiro Yamaoka, Osaka (JP); Junichi Kanou, Osaka (JP); Akira Minegishi, Osaka (JP); Atsushi Yamamoto, Kyoto (JP); Kohei Masuda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/367,146

(22) Filed: Dec. 1, 2016

(65) Prior Publication Data
US 2017/0229974 A1    Aug. 10, 2017

(30) Foreign Application Priority Data
Feb. 9, 2016   (JP) .................................. 2016-022507

(51) Int. Cl.
| | |
|---|---|
| *H03K 7/02* | (2006.01) |
| *H03K 9/02* | (2006.01) |
| *H03K 9/04* | (2006.01) |
| *H03K 7/04* | (2006.01) |
| *H02M 5/293* | (2006.01) |
| *H02M 5/297* | (2006.01) |

(52) U.S. Cl.
CPC ................. *H03K 7/02* (2013.01); *H03K 9/02* (2013.01); *H02M 5/293* (2013.01); *H02M 5/297* (2013.01); *H03K 7/04* (2013.01); *H03K 9/04* (2013.01)

(58) Field of Classification Search
CPC ............ H02M 5/40–5/4585; H03K 7/00–9/10
USPC .................................................. 375/238, 242
See application file for complete search history.

(56) References Cited

U.S. PATENT DOCUMENTS

| | | | | |
|---|---|---|---|---|
| 4,979,087 A * | 12/1990 | Sellwood | ................ | H01F 38/14 363/34 |
| 7,203,248 B1 * | 4/2007 | Liang | .................. | H04L 25/4927 370/207 |
| 7,855,677 B2 * | 12/2010 | Negoro | ................... | H04J 13/10 342/159 |

(Continued)

FOREIGN PATENT DOCUMENTS

| | | |
|---|---|---|
| JP | 2006-254694 | 9/2006 |
| JP | 2008-278558 | 11/2008 |

(Continued)

*Primary Examiner* — Gary L Laxton
*Assistant Examiner* — Peter Novak
(74) *Attorney, Agent, or Firm* — McDermott Will & Emery LLP

(57) ABSTRACT

A converter includes: a terminal that receives code-modulated power into which first alternating-current power has been code-modulated with a modulation code; and a circuit that converts the code-modulated power with a conversion code to generate second alternating-current power. The conversion code is based on the modulation code. A frequency of the second alternating-current power is lower than a frequency of the first alternating-current power.

17 Claims, 34 Drawing Sheets

(56) References Cited

U.S. PATENT DOCUMENTS

| | | | |
|---|---|---|---|
| 2004/0066094 A1 | 4/2004 | Suzuki et al. | |
| 2004/0090372 A1* | 5/2004 | Nallo | H01Q 1/243 |
| | | | 343/700 MS |
| 2012/0185708 A1 | 7/2012 | Rekimoto et al. | |
| 2015/0016155 A1 | 1/2015 | Lee et al. | |
| 2016/0308472 A1* | 10/2016 | Floreancig | H02M 1/36 |
| 2017/0201123 A1* | 7/2017 | Park | H02J 50/10 |

FOREIGN PATENT DOCUMENTS

| | | |
|---|---|---|
| JP | 2011-091954 | 5/2011 |
| JP | 2013-138612 | 7/2013 |
| WO | 2013/145248 | 10/2013 |

* cited by examiner

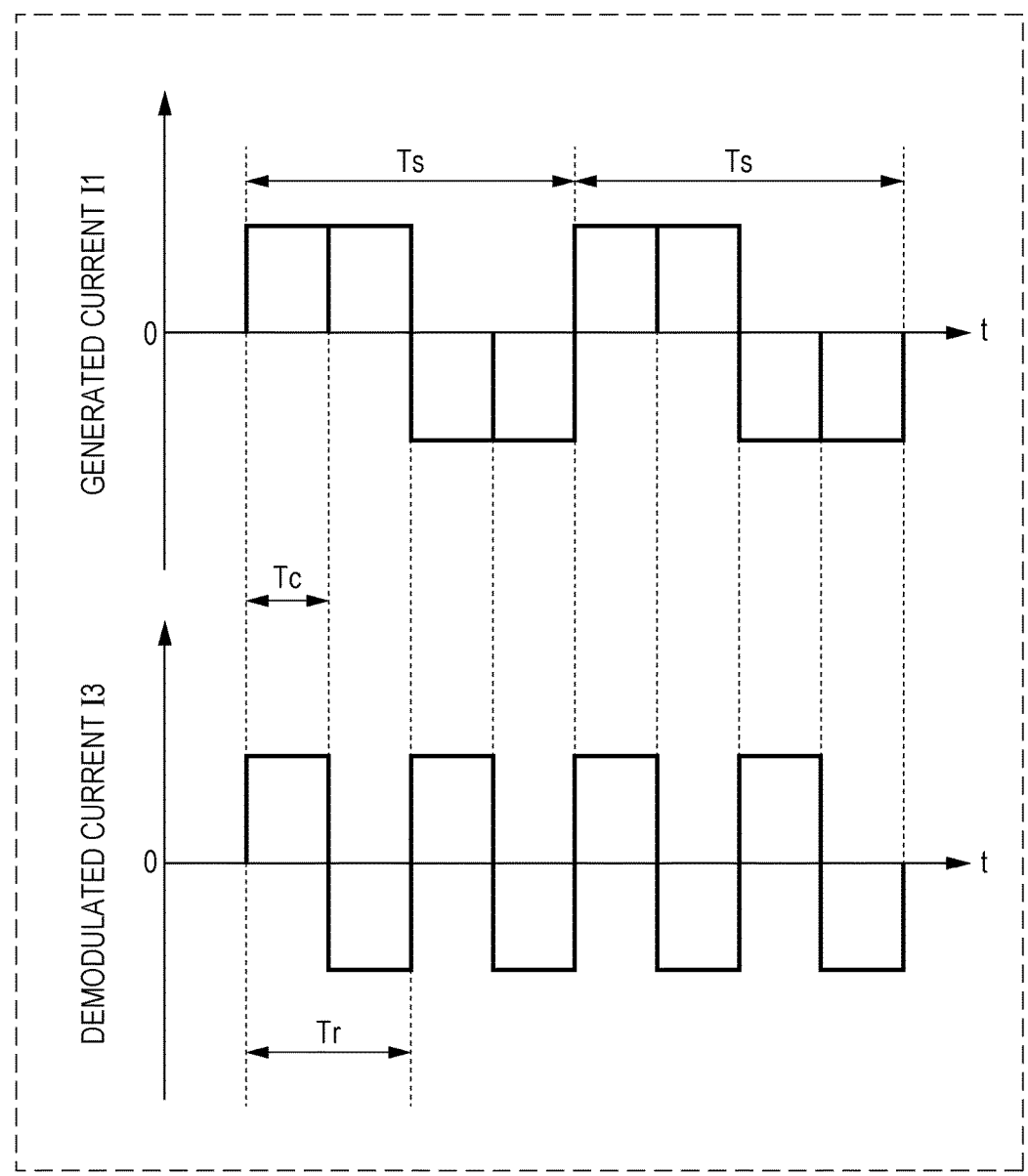

CONVERTER FOR CONVERTING CODE-MODULATED POWER WITH CONVERSION CODE, POWER TRANSMISSION SYSTEM, AND CONTROLLER

BACKGROUND

1. Technical Field

The present disclosure relates to a code modulator, a converter, a controller, and a power transmission system including the same.

2. Description of the Related Art

Recent years have seen a sharp increase in supply of power generated using natural energy in addition to supply of commercial power from an electric power company. Also, installing local, small-scale power grids has been proposed in order to reduce losses due to long-distance power transmission.

Japanese Patent No. 5612718 discloses a multi-terminal power conversion apparatus for asynchronously and flexibly supplying power.

Japanese Unexamined Patent Application Publication No. 2011-91954 discloses a power supply apparatus including a communication unit that transmits/receives information signals to/from another apparatus and a power-supply unit that supplies power to the other apparatus.

SUMMARY

In one general aspect, the techniques disclosed here feature a converter including: a terminal that receives code-modulated power into which first alternating-current (AC) power has been code-modulated with a modulation code; and a circuit that converts the code-modulated power with a conversion code to generate second AC power. The conversion code is generated based on the modulation code. A frequency of the second AC power is lower than a frequency of the first AC power.

It should be noted that general or specific embodiments may be implemented as a converter, a code modulator, a controller, a power transmission system, and a power transmission method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 18 is a diagram illustrating the waveforms of a generated current and a demodulated current according to a first example operation of a first embodiment;

DETAILED DESCRIPTION

Figure 1:
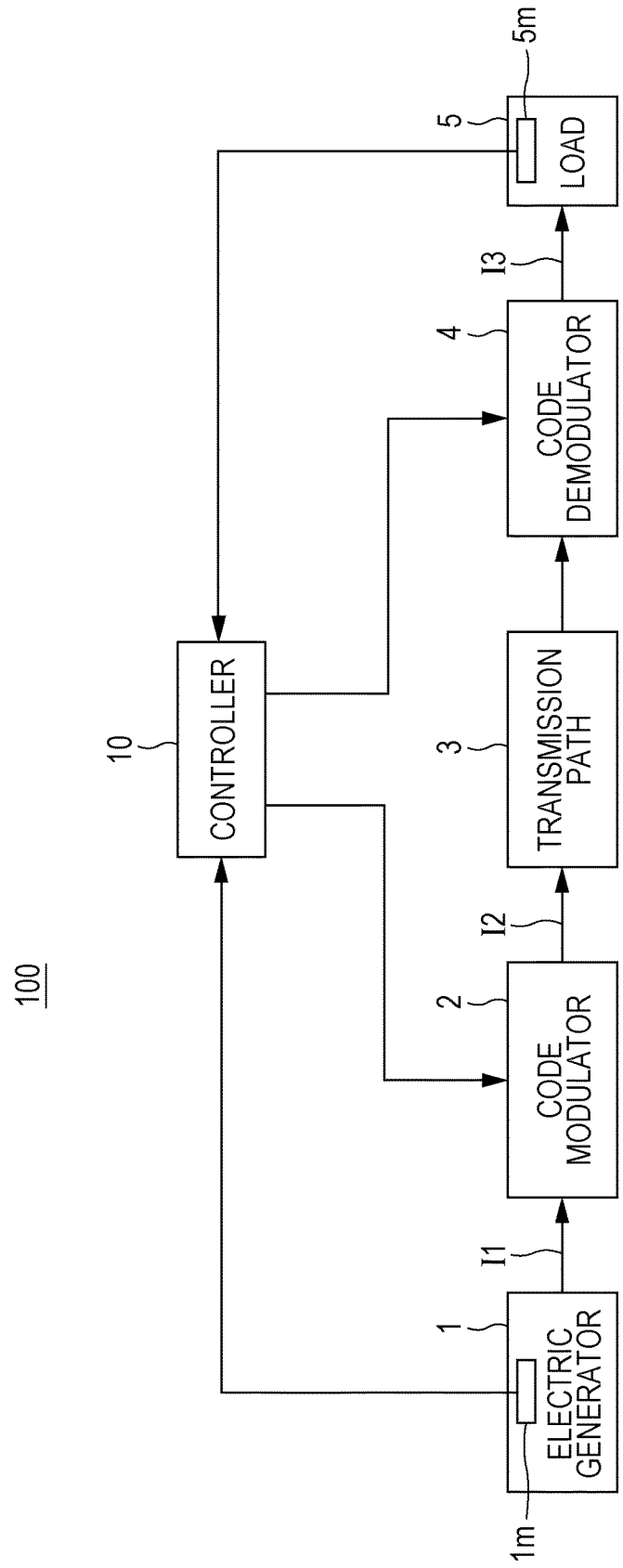
FIG. 1 is a block diagram illustrating an example configuration of a power transmission system according to a first reference mode.

Reference modes and embodiments according to the present disclosure will be described below with reference to the accompanying drawings. In the reference modes and embodiments described below, the same or similar constituent elements are denoted by the same reference numerals and/or the same names.

The descriptions below are all given of comprehensive or specific examples. Numerical values, codes, waveforms, the types of element, the arrangement and connection of elements, signal flows, and circuit blocks described below are examples and are not intended to limit the present disclosure. In addition, constituent element not set forth in the independent claims that represent the broadest concept are optional constituent elements.

First Reference Mode

[1. Power Transmission System]

FIG. 1 illustrates the configuration of a power transmission system 100 according to a first reference mode. The power transmission system 100 includes an electric generator 1, a code modulator 2, a transmission path 3, a code demodulator 4, a load 5, and a controller 10.

The electric generator 1 generates electric power (e.g., direct-current (DC) power). The code modulator 2 code-modulates the generated power with a modulation code to thereby generate code-modulated power (i.e., a code-modulated wave). The code-modulated power is transmitted from the code modulator 2 to the code demodulator 4 through the transmission path 3. The transmission path 3 is, for example, a wired transmission path. The code demodulator 4 code-demodulates the code-modulated power with a demodulation code to thereby obtain power (e.g., DC power). The obtained power is supplied to, for example, the load 5.

The modulation code and the demodulation code each are a signal including a predetermined code sequence.

The code-modulated power is power whose current direction or voltage polarity reverses periodically or aperiodically. The code-modulated power has, for example, a waveform whose polarity changes at every predetermined period (e.g., a period corresponding to an integer multiple of a unit period).

The electric generator 1 has, for example, a power measuring instrument 1m. The power measuring instrument 1m measures the amount of electricity generated by the electric generator 1 and transmits the measured amount of the generated electricity to the controller 10. The amount of electricity generated corresponds to, for example, the amount of power transmitted from the electric generator 1 to the code modulator 2. The power measuring instrument 1m may be provided at a stage prior to the code modulator 2.

The load 5 has, for example, a power measuring instrument 5m. The power measuring instrument 5m measures the amount of power used by the load 5 and transmits the measured amount of power used to the controller 10. The amount of power used corresponds to, for example, the amount of power transmitted from the code demodulator 4 to the load 5. The power measuring instrument 5m may be provided at a stage subsequent to the code demodulator 4.

Each of the electric generator 1 and the load 5 may be, for example, a power storage device, such as a battery or a capacitor. In this case, for example, power generated in a time slot in which the amount of power consumption is small can be stored, and the stored power can be effectively used. This makes it possible to enhance the power efficiency of the entire system.

The controller 10 receives information about the measured amounts of power and controls the operations of the code modulator 2 and the code demodulator 4 on the basis of the corresponding amounts of power. For example, the controller 10 transmits instruction signals to the code modulator 2 and the code demodulator 4.

The instruction signals include a synchronization signal for making the operation of the code modulator 2 and the operation of the code demodulator 4 synchronize with each other. The instruction signals transmitted to the code modulator 2 include, for example, timing information indicating a timing at which the generated power is to be code-modulated, and the instruction signals transmitted to the code demodulator 4 include, for example, timing information indicating a timing at which the code-modulated power is to be code-demodulated. This makes it possible to cause the code modulation and the code demodulation of power to synchronize with each other accurately.

The instruction signals transmitted to the code modulator 2 include, for example, code information regarding the modulation code, and the instruction signals transmitted to the code demodulator 4 include, for example, code information regarding the demodulation code. In the present disclosure, the "code information" may be a code sequence itself, may be designation information for designating a specific one of a plurality of code sequences, or may be parameter information for generating a code sequence.

For example, the controller 10 may transmit a code sequence of a modulation code to the code modulator 2 and may transmit a code sequence of a demodulation code to the code demodulator 4.

For example, the controller 10 may transmit designation information that designates a code sequence of a modulation code to the code modulator 2, and the code modulator 2 may generate a modulation code on the basis of the designation information. The controller 10 may transmit designation information that designates a code sequence of a demodulation code to the code demodulator 4, and the code demodulator 4 may generate a demodulation code on the basis of the designation information.

Alternatively, the modulation code may be pre-set in the code modulator 2, and the demodulation code may be pre-set in the code demodulator 4.

Now, suppose a case in which the power transmission system 100 includes a plurality of electric generators 1, a plurality of code modulators 2, a plurality of code demodulators 4, and a plurality of loads 5, by way of example. In this case, for example, the controller 10 transmits the code information regarding the modulation code to one code modulator 2 selected from the plurality of code modulators 2 and transmits the code information regarding the demodulation code to one code demodulator 4 selected from the plurality of code demodulators 4. This allows power to be transmitted from the electric generator 1 connected to the selected code modulator 2 to the load 5 connected to the selected code demodulator 4.

FIG. 1 illustrates a generated current I1, a code-modulated current I2, and a code-demodulated current I3, instead of the generated power, the code-modulated power, and the code-demodulated power. Although an example in which a current is modulated and demodulated is described below, the present disclosure is not limited thereto, and for example, a voltage may be modulated and demodulated. The "current" in the description below can be read instead as a "voltage" or "power", as appropriate.

[2. Transmission Efficiency of Code-Modulated Power]

Figure 2:
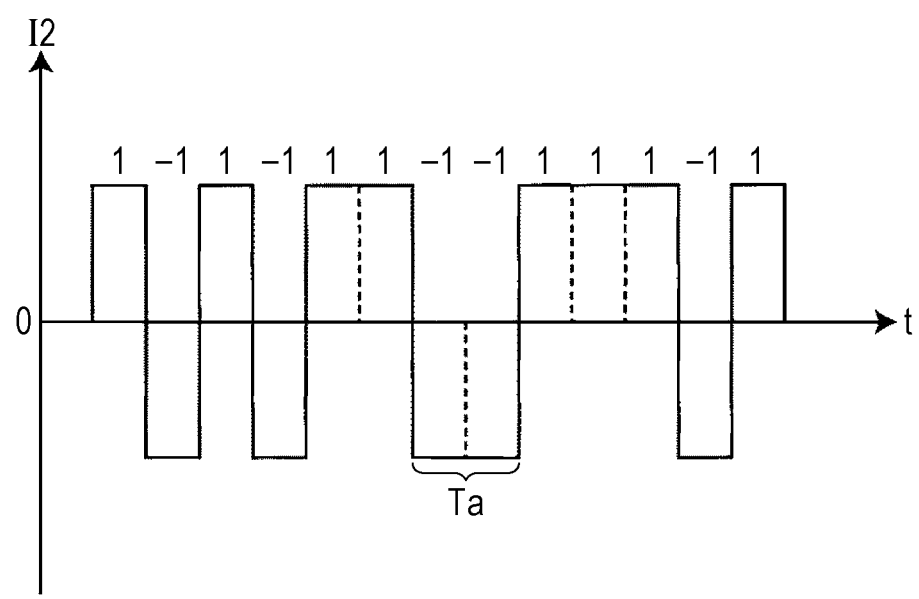
FIG. 2 is a diagram illustrating one example of the waveform of a modulated current according to the first reference mode.
Figure 3:
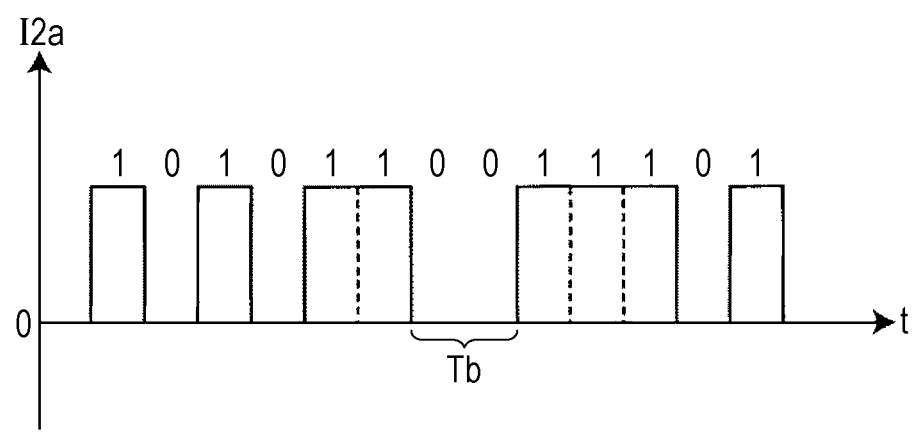
FIG. 3 is a diagram illustrating an example of the waveform of a modulated current according to a comparative example.

FIG. 2 illustrates an example of the waveform of the modulated current I2. FIG. 3 illustrates an example of the waveform of a modulated current I2a according to a comparative example. In FIG. 2, 1s and −1s represent values constituting a modulation code, the values corresponding to the current values of the modulated current I2 in corresponding periods. In FIG. 3, 1s and 0s represent values constituting a modulation code, the values corresponding to the current values of the modulated current I2a in corresponding periods. A code sequence consisting of 0s and 1s corresponds to a modulation code used in a typical communication system.

In the example illustrated in FIG. 2, the code modulator 2 converts the generated current I1 into a modulated wave (i.e., the modulated current I2) having "1s" and "−1s". Thus, in each period in which the modulated current I2 indicates "1", positive current is transmitted from the code modulator 2 to the code demodulator 4, and in each period in which the modulated current I2 indicates "−1" (e.g., a period Ta in FIG. 2), negative current is transmitted from the code modulator 2 to the code demodulator 4. Thus, power is transmitted in all periods, thereby realizing high transmission efficiency.

In the example illustrated in FIG. 3, the modulated current I2a has a modulated wave having "1s" and "0s". In this case, in a period in which the modulated current I2a indicates "0" (e.g., a period Tb in FIG. 3), the modulated current I2a becomes zero, and thus no power is transmitted. Consequently, the power transmission efficiency decreases.

Comparison between FIG. 2 and FIG. 3 shows that power can be transmitted with high transmission efficiency when the current and/or the voltage of the code-modulated power selectively takes a positive value and a negative value, particularly, when the code sequence of a modulation code does not include "0".

[3. Code Modulation and Demodulation of DC Power]

Figure 4A:
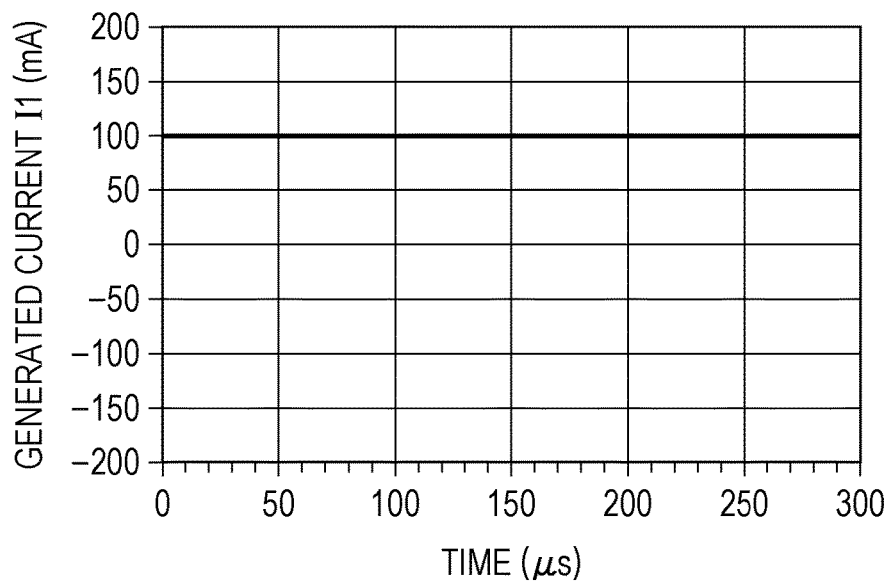
FIG. 4A is a graph illustrating one example of the waveform of the generated current according to the first reference mode.
Figure 4B:
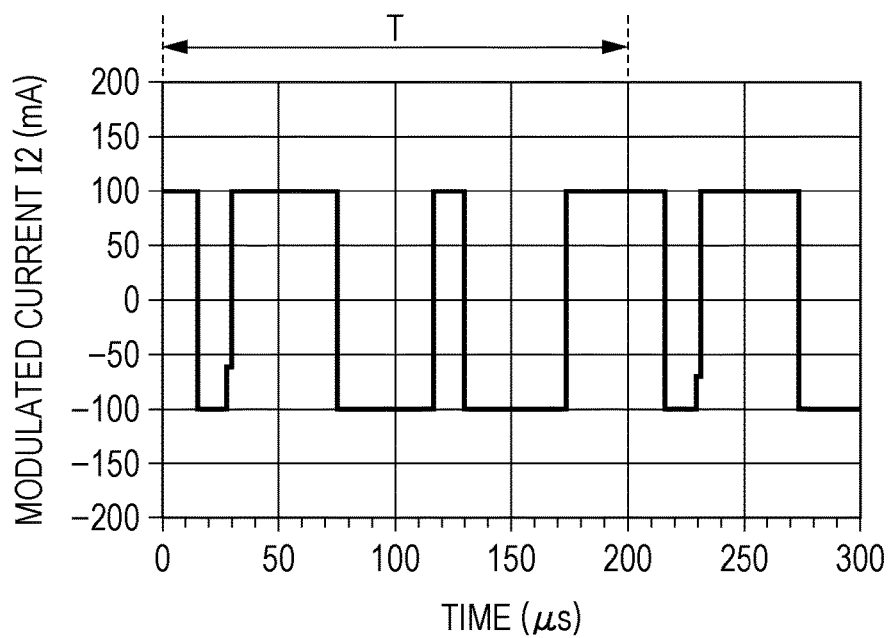
FIG. 4B is a diagram illustrating one example of the waveform of the modulated current according to the first reference mode.
Figure 4C:
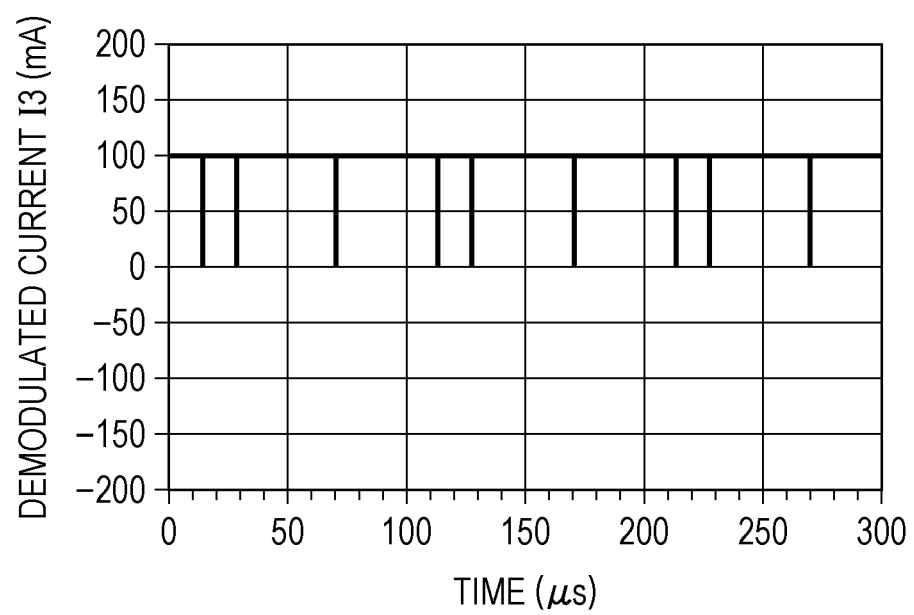
FIG. 4C is a diagram illustrating one example of the waveform of the demodulated current according to the first reference mode.

FIGS. 4A to 4C illustrate examples of the waveforms of the generated current I1, the modulated current I2, and the demodulated current I3, respectively.

The generated current I1 illustrated in FIG. 4A was DC.

The modulated current I2 illustrated in FIG. 4B was obtained by multiplying the generated current I1 by a modulation code M1. In this example, the modulation code M1 had a code sequence given by:

$$M1=[1\ -1\ 1\ 1\ 1\ -1\ -1\ -1\ 1\ -1\ -1\ -1\ 1\ 1] \quad (1)$$

The frequency of the modulation code was 35 kHz, and the time span of each value constituting the modulation code was 14.3 (={1/(35 kHz)}/2) μs. A period T illustrated in FIG. 4B represents one cycle of the code sequence of the modulation code M1.

The demodulated current I3 illustrated in FIG. 4C was obtained by multiplying the modulated current I2 with a demodulation code D1. In this example, the modulation code M1 and the demodulation code D1 had the same code sequence. That is, the demodulation code D1 had code sequences given by:

$$D1=[1\ -1\ 1\ 1\ 1\ -1\ -1\ -1\ 1\ -1\ -1\ -1\ 1\ 1] \quad (2)$$

In this case, the frequency of the demodulation code was 35 kHz, and the time span of each value constituting the demodulation code was 14.3 μs.

A result obtained by multiplying the modulated current I2 by the demodulation code D1 corresponds to a result obtained by multiplying the generated current I1 by M1×D1. In this case, M1×D1 has a code sequence given by:

$$M1\times D1=[1\ 1\ 1\ 1\ 1\ 1\ 1\ 1\ 1\ 1\ 1\ 1\ 1\ 1] \quad (3)$$

Thus, as illustrated in FIG. 4C, a DC equivalent to the generated current I1 was restored as the demodulated current I3 through the code modulation and the code demodulation.

As described above, the modulation and demodulation method according to this reference mode makes it possible to realize low-loss power transmission through accurate synchronization.

For example, when the modulation code M1 is repeatedly used in the manner illustrated in FIG. 4B, power can be transmitted with high efficiency for a long period of time.

In the above-described example, the eighth to 14th values of the modulation code M1 respectively correspond to values obtained by reversing the polarities of the first to seventh values of the modulation code M1.

[4. Code Modulator and Code Demodulator]

Figure 5:
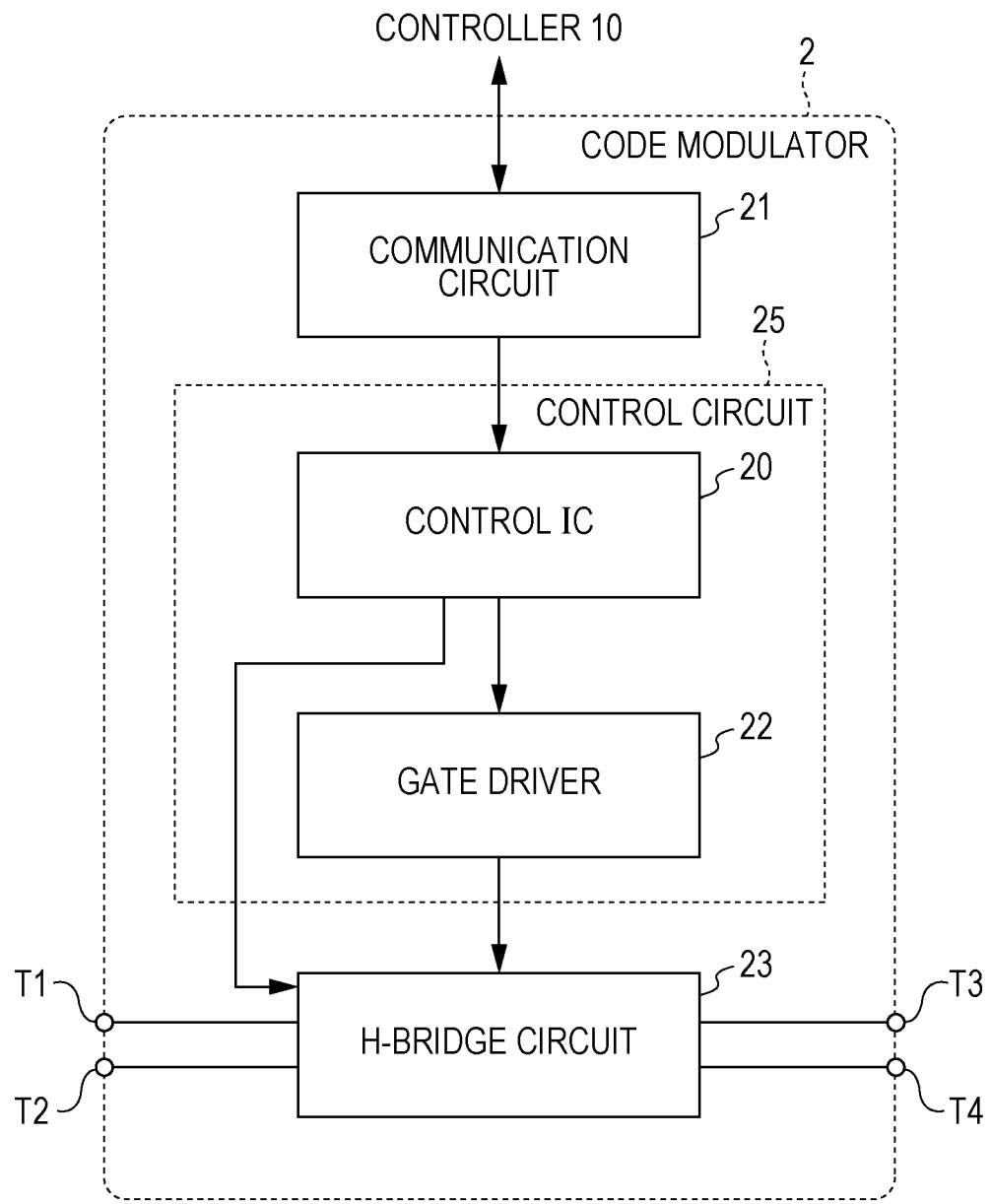
FIG. 5 is a block diagram illustrating an example configuration of a code modulator according to the first reference mode.

FIG. 5 illustrates an example configuration of the code modulator 2.

In FIG. 5, the code modulator 2 includes a communication circuit 21, a control circuit 25, and an H-bridge circuit 23. The control circuit 25 includes, for example, a control integrated circuit (IC) 20 and a gate driver 22.

The communication circuit 21 receives the instruction signals from the controller 10 and outputs the instruction signals to the control IC 20. The communication circuit 21 includes, for example, an antenna, a tuner circuit, and a wave detector.

The instruction signals include, for example, a synchronization signal and code information regarding the modulation code. Each synchronization signal may be, for example, a trigger signal for starting the modulation or may be a trigger signal for ending the modulation. Alternatively, the synchronization signal may be, for example, time information indicating the time at which the modulation is to be started or time information indicating the time at which the modulation is to be ended. The trigger signals and the time information are examples of timing information in the present disclosure.

The control IC 20 generates a modulation code on the basis of the instruction signals and causes the gate driver 22 to generate control signals according to the modulation code. The control IC 20 includes a processor. The control IC 20 is, for example, a microcomputer.

The gate driver 22 outputs the control signals to the H-bridge circuit 23 to thereby cause the H-bridge circuit 23 to execute a code modulation operation.

The code modulator 2 has input terminals T1 and T2 connected to the electric generator 1 and output terminals T3 and T4 connected to the transmission path 3. The input terminals T1 and T2 function as an input port, and the output terminals T3 and T4 function as an output port.

Figure 6:
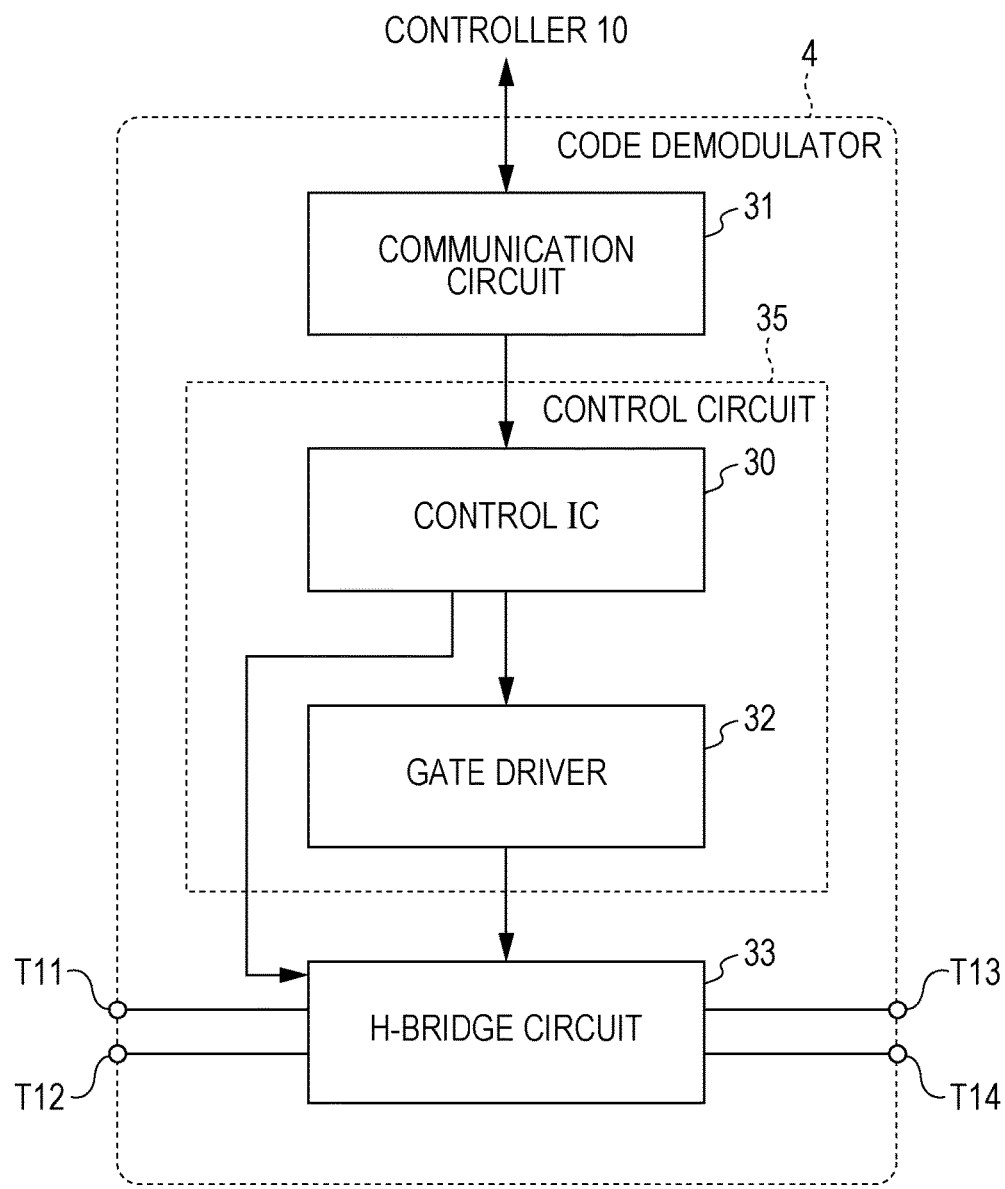
FIG. 6 is a block diagram illustrating an example configuration of a code demodulator according to the first reference mode.

FIG. 6 illustrates an example configuration of the code demodulator 4.

In FIG. 6, the code demodulator 4 includes a communication circuit 31, a control circuit 35, and an H-bridge circuit 33. The control circuit 35 includes, for example, a control IC 30 and a gate driver 32.

The communication circuit 31 receives the instruction signals from the controller 10 and outputs the instruction signals to the control IC 30. The communication circuit 31 includes, for example, an antenna, a tuner circuit, and a wave detector.

The instruction signals include, for example, a synchronization signal and code information regarding the demodulation code. The synchronization signal may be, for example, a trigger signal for starting the demodulation or a trigger signal for ending the demodulation. Alternatively, the synchronization signal may be, for example, time information indicating the time at which the demodulation is to be started or time information indicating the time at which the demodulation is to be ended. The trigger signals and the time information are examples of the timing information in the present disclosure.

The control IC 30 generates a demodulation code on the basis of the instruction signals and causes the gate driver 32 to generate control signals according to the demodulation code. The control IC 30 includes a processor and is, for example, a microcomputer.

The gate driver 32 outputs the control signals to the H-bridge circuit 33 to thereby cause the H-bridge circuit 33 to execute a code demodulation operation.

The code demodulator 4 has input terminals T11 and T12 connected to the transmission path 3 and output terminals T13 and T14 connected to the load 5. The input terminals T11 and T12 function as an input port, and the output terminals T13 and T14 function as an output port.

As illustrated in FIG. 1, the controller 10 transmits the control signals to the code demodulator 4 and the code modulator 2 through paths different from the transmission path 3. The controller 10, however, may transmit the control signals to the code modulator 2 and the code demodulator 4 through the transmission path 3. In this case, the control signals can be transmitted, for example, through multiplexing with the code-modulated power. For example, this reduces the number of communication paths from the controller 10 to the code modulator 2 and the code demodulator 4, thereby making it possible to reduce cost.

Figure 7:
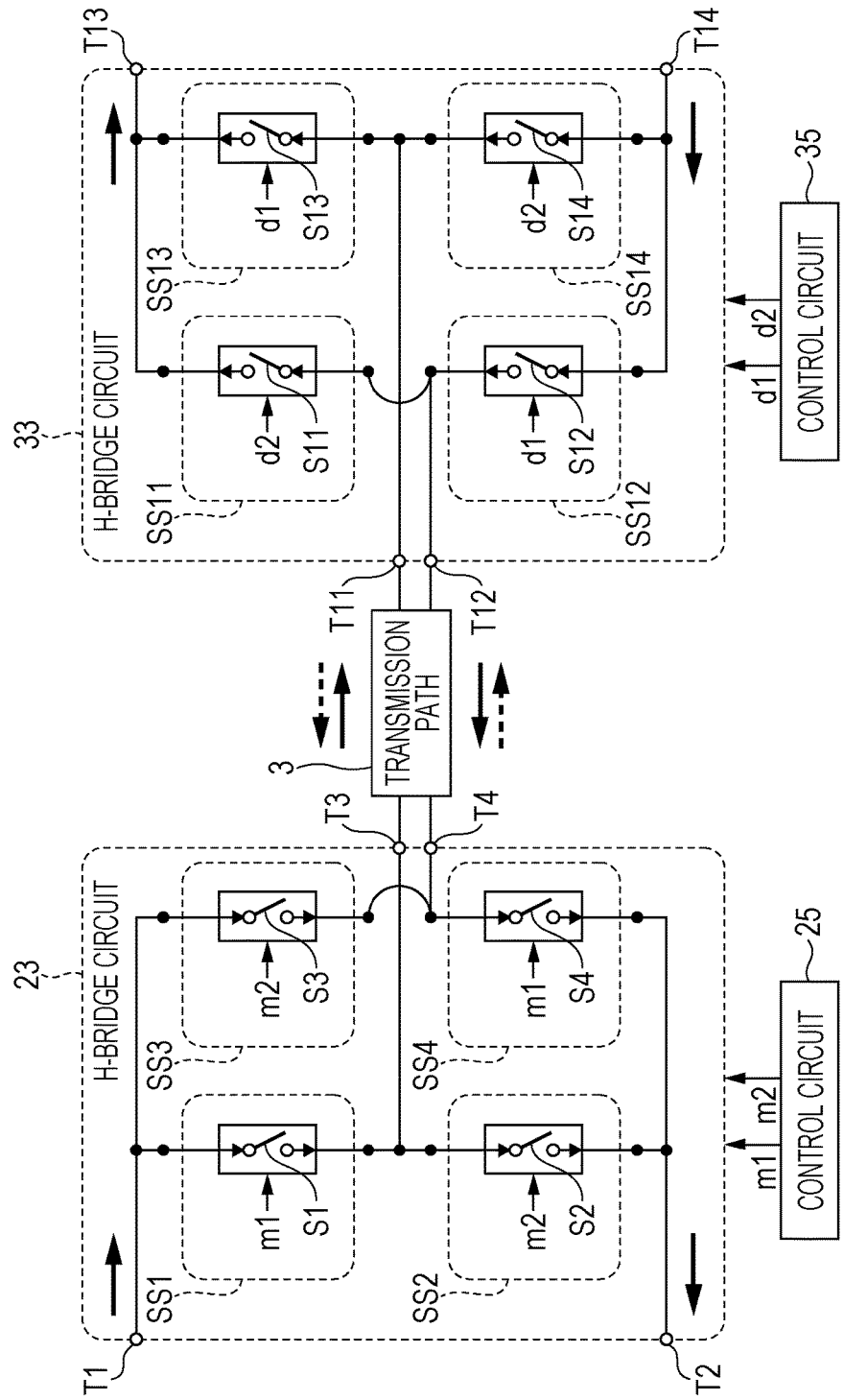
FIG. 7 is a schematic circuit diagram illustrating an example configuration of the code modulator, a transmission path, and the code demodulator according to the first reference mode.

FIG. 7 illustrates an example configuration of the control circuit 25 and the H-bridge circuit 23 in the code modulator 2 and an example configuration of the control circuit 35 and the H-bridge circuit 33 in the code demodulator 4.

In FIG. 7, the H-bridge circuit 23 includes four switch circuits SS1, SS2, SS3, and SS4 connected in a full-bridge configuration. For example, the switch circuits SS1, SS2, SS3, and SS4 include switches S1, S2, S3, and S4, respectively.

In FIG. 7, the H-bridge circuit 33 includes four switch circuits SS11, SS12, SS13, and SS14 connected in a full-bridge configuration. For example, the switch circuits SS11, SS12, SS13, and SS14 include switches S11, S12, S13, and S14, respectively.

Each of the switches S1 to S4 and S11 to S14 may be, for example, a bidirectional switch or a metal-oxide semiconductor (MOS) transistor.

The control circuit 25 generates predetermined code sequences m1 and m2. The control circuit 25 outputs the code sequence m1 to the switches S1 and S4 as control signals and outputs the code sequence m2 to the switches S2 and S3 as control signals.

For example, each of the switches S1 to S4 is in an ON state when a signal indicating "1" is input thereto, and each of the switches S1 to S4 is in an OFF state when a signal indicating "0" is input thereto. When the switch S1 is in the ON state, current flows from the terminal T1 to the terminal T3. When the switch S3 is in the ON state, current flows from the terminal T1 to the terminal T4. When the switch S2 is in the ON state, current flows from the terminal T3 to the terminal T2. When the switch S4 is in the ON state, current flows from the terminal T4 to the terminal T2.

The control circuit 35 generates predetermined code sequences d1 and d2. The control circuit 35 outputs the code sequence d1 to the switches S12 and S13 as control signals and outputs the code sequence d2 to the switches S11 and S14 as control signals.

For example, each of the switches S11 to S14 is in an ON state when a signal indicating "1" is input thereto, and each of the switches S11 to S14 is in an OFF state when a signal indicating "0" is input thereto. When the switch S11 is in the ON state, current flows from the terminal T12 to the terminal T13. When the switch S13 is in the ON state, current flows from the terminal T11 to the terminal T13. When the switch S12 is in the ON state, current flows from the terminal T14 to the terminal T12. When the switch S14 in the ON state, current flows from the terminal T14 to the terminal T11.

In FIG. 7, current that flows in the direction indicated by each solid-line arrow is regarded as positive current. In FIG. 7, the structure of the code modulator 2 and the structure of the code demodulator 4 are generally symmetrical to each other, but the directions in which the currents flow differ from each other.

[5. Operation]

[5-1. Control Signals]

Table 1 illustrates examples of code sequences of the control signals m1 and m2 input to the switches S1 to S4 in the code modulator 2 and examples of code sequences of the control signals d1 and d2 input to the switches S11 to S14 in the code demodulator 4.

TABLE 1

| CONTROL SIGNAL | CODE SEQUENCE |
|---|---|
| m1 | c1a = [1011100] |
| m2 | c1b = [0100011] |
| d1 | c1a = [1011100] |
| d2 | c1b = [0100011] |

In the examples, the code sequence of the control signals m1 and the code sequence of control signals d1 are the same code sequence c1a, and the code sequence of the control signals m2 and the code sequence of the control signals d2 are the same code sequence c1b. The code sequence c1b is a sequence obtained by inverting all bits of the code sequence c1a.

[5-2. Operation of Code Modulator]

A description will be given of the operation of the code modulator 2.

When the control signal m1 indicates "1", and the control signal m2 indicates "0", the switches S1 and S4 are in the ON state, and the switches S2 and S3 in the OFF state. At this point in time, a positive generated current I1 input to the code modulator 2 flows in the direction indicated by the solid-line arrow in FIG. 7, so that a positive modulated current I2 flows to the terminals T3 and T4. That is, the generated current I1 is code-modulated with "1".

On the other hand, when the control signal m1 indicates "0", and the control signal m2 indicates "1", the switches S1 and S4 are in the OFF state, and the switches S2 and S3 are in the ON state. At this point in time, a positive generated current I1 input to the code modulator 2 flows in the direction indicated by the dotted-line arrow in FIG. 7, so that a negative modulated current I2 flows to the terminals T3 and T4. That is, the generated current I1 is code-modulated with "−1".

The series of switching operations based on the control signals m1 and m2 illustrated in Table 1 corresponds to an operation for code-modulating the generated current I1 with a modulation code Ma given by:

$$Ma=[1\ -1\ 1\ 1\ 1\ -1\ -1] \quad (4)$$

Thus, the code modulator 2 code-modulates the generated current I1 with the modulation code Ma and outputs the modulated current I2 to the transmission path 3 via the terminals T3 and T4.

[5-3. Operation of Code Demodulator]

A description will be given of the operation of the code demodulator 4.

The control signals d1 and d2 are synchronized with the control signals m1 and m2. Thus, when a positive modulated current I2 is input to the code demodulator 4, the control signal d1 indicates "1", and the control signal d2 indicates "0". At this point in time, the switches S13 and S12 are in the ON state, and the switches S11 and S14 are in the OFF state. Thus, the positive modulated current I2 flows in the direction indicated by the solid-line arrow in FIG. 7, so that a positive demodulated current I3 flows to the terminals T13 and T14. That is, the modulated current I2 is code-demodulated with "1".

On the other hand, when a negative modulated current I2 is input to the code demodulator 4, the control signal d1 indicates "0", and the control signal d2 indicates "1". At this point in time, the switches S11 and S14 are in the ON state, and the switches S12 and S13 are in the OFF state. Thus, the negative modulated current I2 flows in the direction indicated by the solid-line arrow in FIG. 7, so that a positive demodulated current I3 flows to the terminals T13 and T14. That is, the modulated current I2 is code-demodulated with "−1".

The series of switching operations based on the control signals d1 and d2 in Table 1 corresponds to an operation for code-demodulating the modulated current I2 with a demodulation code Da given by:

$$Da=[1\ -1\ 1\ 1\ 1\ -1\ -1] \quad (5)$$

Thus, the code demodulator 4 code-demodulates the modulated current I2 with the demodulation code Da and outputs the positive demodulated current I3 via the terminals T13 and T14.

[5-4. Other Examples of Control Signals]

Table 2 illustrates other examples of the code sequences of the control signals m1, m2, d1, and d2.

TABLE 2

| CONTROL SIGNAL | CODE SEQUENCE |
|---|---|
| m1 | [c1a c1b] = [10111000100011] |
| m2 | [c1b c1a] = [01000111011100] |
| d1 | [c1a c1b] = [10111000100011] |
| d2 | [c1b c1a] = [01000111011100] |

In each of the code sequences of the control signals m1 and m2 illustrated in Table 1, the number of 1s is not equal to the number of 0s. Thus, in the code sequence of the modulation code Ma, the number of 1s and the number of −1s are not equal to each other. In such a case, the average of the modulated current I2 does not become 0, and the modulated current I2 includes a small amount of DC components except for AC components.

On the other hand, in Table 2, the control signals m1 and d1 each have a code sequence [c1a c1b] in which the code sequence c1a and the code sequence c1b are coupled in tandem, and the control signals m2 and d2 each have a code sequence [c1b c1a] in which the code sequence c1b and the code sequence c1a are coupled in tandem. Since the code sequence c1b is a sequence in which all bits of the code sequence c1a are inverted, as described above, the number of 1s and the number of 0s in a code sequence in which the code sequences c1a and c1b are coupled are equal to each other. This makes it possible to prevent DC components from being included in the modulated current I2.

Second Reference Mode

A power transmission system according to a second reference mode is substantially the same as the power transmission system 100 described above in the first reference mode, except that the generated power is AC power. The following description will be given of the second reference mode, particularly, points that are different from the first reference mode.

[1. Code Modulation and Demodulation of AC Power]

Figure 8A:
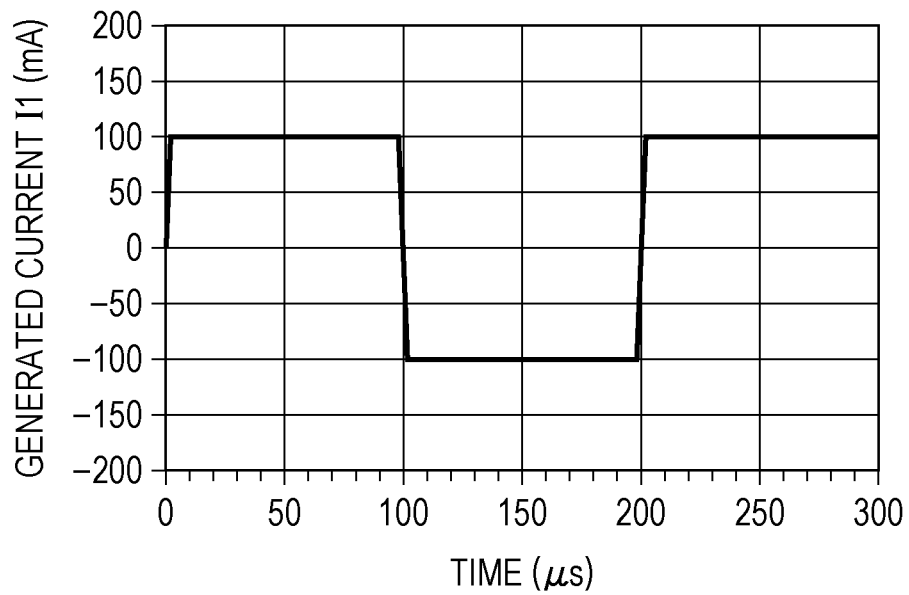
FIG. 8A is a graph illustrating one example of the waveform of a generated current according to a second reference mode.
Figure 8B:
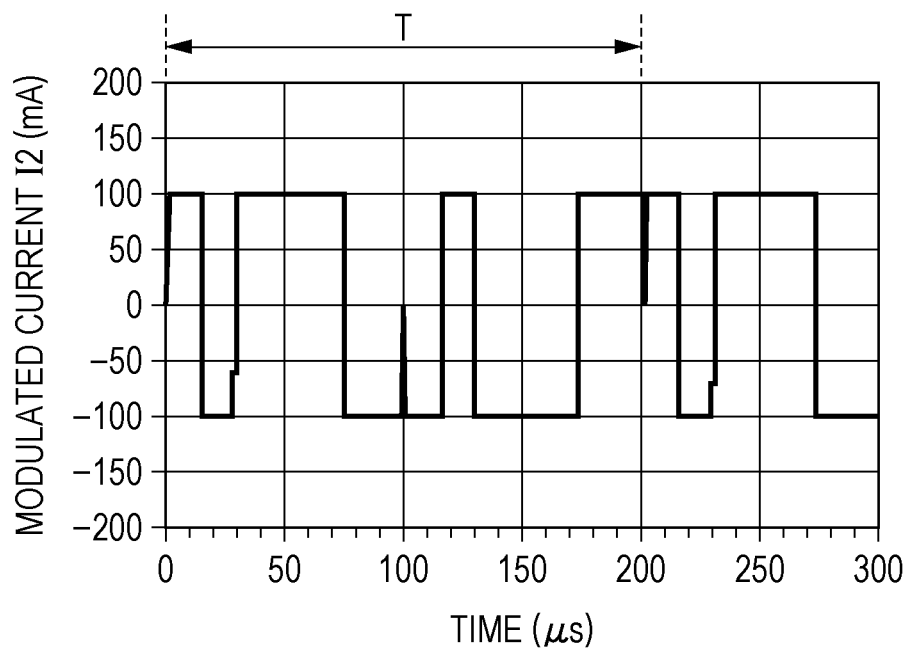
FIG. 8B is a graph illustrating one example of the waveform of a modulated current according to the second reference mode.
Figure 8C:
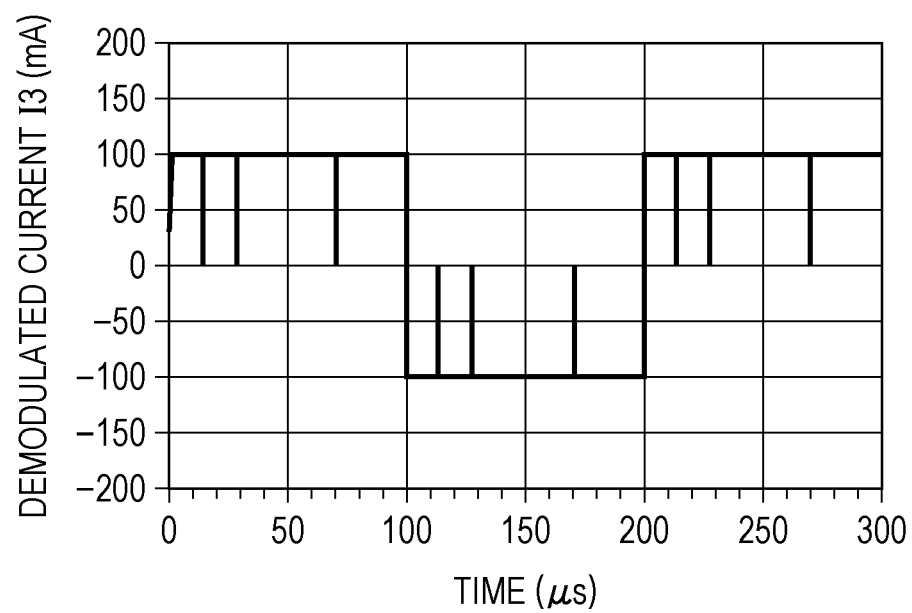
FIG. 8C is a graph illustrating one example of the waveform of a demodulated current according to the second reference mode.

FIGS. 8A to 8C illustrate examples of the waveforms of a generated current I1, a modulated current I2, and a demodulated current I3, respectively.

The generated current I1 illustrated in FIG. 8A was an AC having a rectangular waveform with a frequency of 5 kHz. The modulated current I2 illustrated in FIG. 8B was obtained by multiplying the generated current I1 by the modulation code M1. The demodulated current I3 illustrated in FIG. 8C was obtained by multiplying the modulated current I2 by the demodulation code D1. The modulation code M1 and the demodulation code D1 were the same as those described in the first reference mode. As illustrated in FIG. 8C, an AC equivalent to the generated current I1 was restored as the demodulated current I3 through the code modulation and the code demodulation.

Accordingly, even when the generated power is AC power, the power can be transmitted with high transmission efficiency, as in the case in which the generated power is DC power.

[2. Code Modulator and Code Demodulator]

Figure 9:
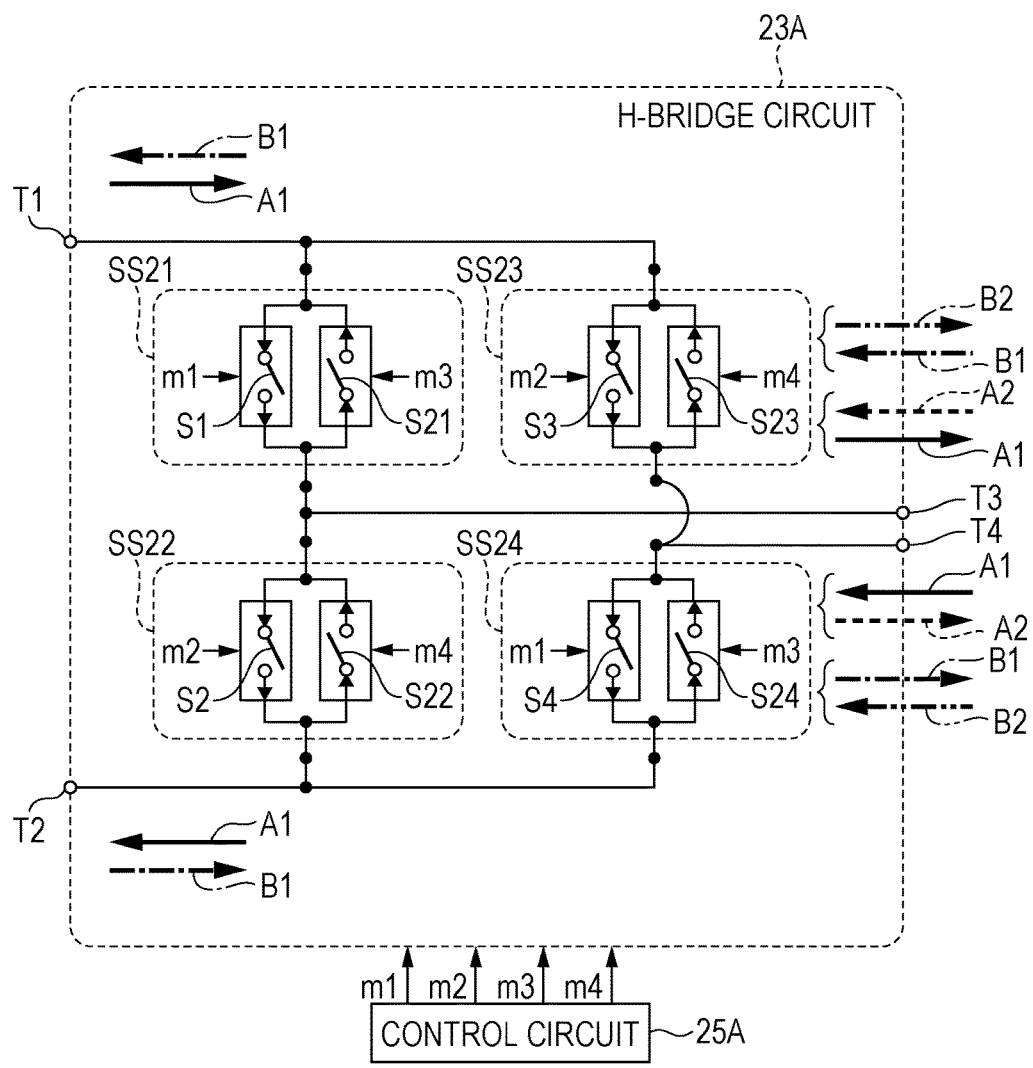
FIG. 9 is a schematic circuit diagram illustrating an example configuration of a code modulator according to the second reference mode.

FIG. 9 illustrates an example configuration of a control circuit 25A and an H-bridge circuit 23A in the code modulator 2 according to the second reference mode. The circuit illustrated in FIG. 9 differs from the circuit illustrated in FIG. 7 in the following points.

(1) The switch circuits SS1 to SS4 illustrated in FIG. 7 are replaced with bidirectional switch circuits SS21 to SS24.

(2) The control circuit 25 illustrated in FIG. 7 is replaced with the control circuit 25A. The control circuit 25A outputs code sequences m1 to m4 to the H-bridge circuit 23A as control signals.

The switch circuit SS21 includes, in addition to a switch S1 as illustrated in FIG. 7, a switch S21 connected in a direction opposite to and in parallel with the switch S1. The switch S21 is turned on or off in response to the control signal m3. The switch circuit SS22 includes, in addition to a switch S2 as illustrated in FIG. 7, a switch S22 connected in a direction opposite to and in parallel with the switch S2. The switch S22 is turned on or off in response to the control signal m4. The switch circuit SS23 includes, in addition to a switch S3 as illustrated in FIG. 7, a switch S23 connected in a direction opposite to and in parallel with the switch S3. The switch S23 is turned on or off in response to the control signal m4. The switch circuit SS24 includes, in addition to a switch S4 as illustrated in FIG. 7, a switch S24 connected in a direction opposite to and in parallel with the switch S4. The switch S24 is turned on or off in response to the control signal m3.

The switches S21 to S24 are, for example, MOS transistors.

Figure 10:
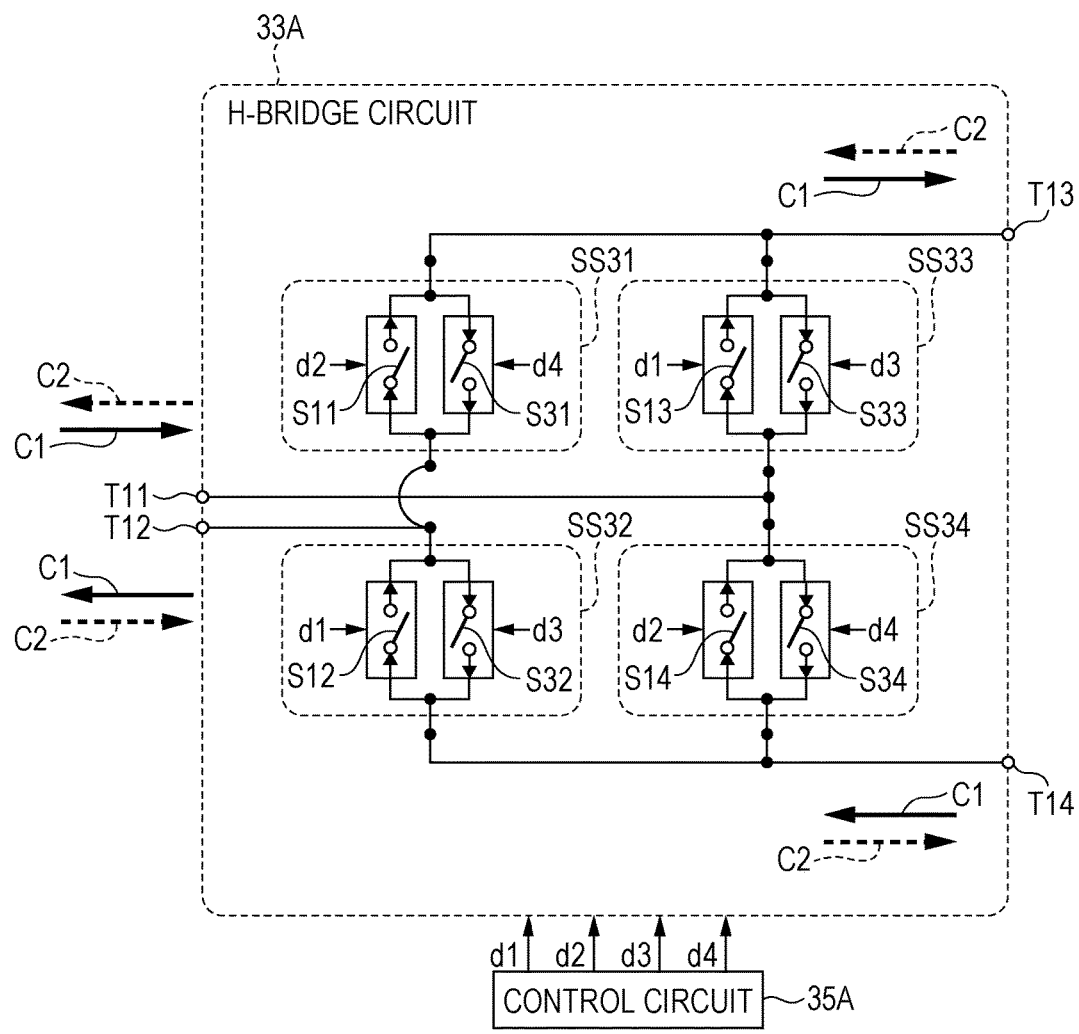
FIG. 10 is a schematic circuit diagram illustrating an example configuration of a code demodulator according to the second reference mode.

FIG. 10 illustrates an example configuration of a control circuit 35A and an H-bridge circuit 33A in the code demodulator 4 according to the second reference mode. The circuit illustrated in FIG. 10 differs from the circuit illustrated in FIG. 7 in the following points.

(1) The switch circuits SS11 to SS14 illustrated in FIG. 7 are replaced with bidirectional switch circuits SS31 to SS34.

(2) The control circuit 35 illustrated in FIG. 7 is replaced with the control circuit 35A. The control circuit 35A outputs code sequences d1 to d4 to the H-bridge circuit 33A as control signals.

The switch circuit SS31 includes, in addition to a switch S11 as illustrated in FIG. 7, a switch S31 connected in a direction opposite to and in parallel with the switch S11. The switch S31 is turned on or off in response to the control signal d4. The switch circuit SS32 includes, in addition to a switch S12 as illustrated in FIG. 7, a switch S32 connected in a direction opposite to and in parallel with the switch S12. The switch S32 is turned on or off in response to the control signal d3. The switch circuit SS33 includes, in addition to a switch S13 as illustrated in FIG. 7, a switch S33 connected in a direction opposite to and in parallel with the switch S13. The switch S33 is turned on or off in response to the control signal d3. The switch circuit SS34 includes, in addition to a switch S14 as illustrated in FIG. 7, a switch S34 connected in a direction opposite to and in parallel with the switch S14. The switch S34 is turned on or off in response to the control signal d4.

The switches S31 to S34 are, for example, MOS transistors.

[3. Operation]

[3-1. Control Signal]

Table 3 illustrates examples of the code sequences of the control signals m1 to m4 input to the switches S1 to S4 and S21 to S24 in the code modulator 2 and examples of the code sequences of the control signals d1 to d4 input to the switches S11 to S14 and S31 to S34 in the code demodulator 4.

TABLE 3

| CONTROL SIGNAL | CODE SEQUENCE |
| --- | --- |
| m1 | [c1a c0] = [10111000000000] |
| m2 | [c1b c0] = [01000110000000] |
| m3 | [c0 c1a] = [00000001011100] |
| m4 | [c0 c1b] = [00000000100011] |
| d1 | [c1a c0] = [10111000000000] |
| d2 | [c1b c0] = [01000110000000] |
| d3 | [c0 c1a] = [00000001011100] |
| d4 | [c0 c1b] = [00000000100011] |

In this example, the code sequences of the control signals m1, m2, m3, and m4 are the same as the code sequences of the control signals d1, d2, d3, and d4, respectively. In Table 3, the code sequence c1b is a code sequence obtained by inverting all bits of the code sequence c1a, and a code sequence c0 is a code sequence in which all bits are 0s. The time span of the code sequences c1a, c1b, and c0 match the half cycle of the AC generated current I1.

[3-2. Operation of Code Modulator]

A description will be given of the operation of the code modulator 2. Now, suppose a case in which the generated current I1 becomes positive in a first half cycle (i.e., a front half of one cycle) and becomes negative in a second half cycle (i.e., a last half of one cycle).

[3-2-1. Operation of Code Modulator in First Half Cycle]

In the first half cycle, the switches S1 to S4 are turned on or off in accordance with the control signals m1 and m2, and the switches S21 to S24 are maintained in the OFF state.

When the control signal m1 indicates "1", and the control signal m2 indicates "0", the switches S1 and S4 are in the ON state, and the switches S2 and S3 are in the OFF state. At this point in time, a positive generated current I1 flows in the direction indicated by arrow A1 in FIG. 9, so that a positive modulated current I2 flows to the terminals T3 and T4. That is, the generated current I1 is code-modulated with "1".

On the other hand, when the control signal m1 indicates "0", and the control signal m2 indicates "1", the switches S1 and S4 are in the OFF state, and the switches S2 and S3 are in the ON state. At this point in time, the positive generated current I1 flows in the direction indicated by arrow A2 in FIG. 9, so that a negative modulated current I2 flows to the terminals T3 and T4. That is, the generated current I1 is code-modulated with "−1".

Thus, in the first half cycle, the code modulator 2 outputs the modulated current I2 to the transmission path 3 via the terminals T3 and T4.

[3-2-2. Operation of Code Modulator in Second Half Cycle]

In the second half cycle, the switches S1 to S4 are maintained in the OFF state, and the switches S21 to S24 are turned on or off in accordance with the control signals m3 and m4.

When the control signal m3 indicates "1", and the control signal m4 indicates "0", the switches S21 and S24 are in the ON state, and the switches S22 and S24 are in the OFF state. At this point in time, a negative generated current I1 input to the code modulator 2 flows in the direction indicated by arrow B1 in FIG. 9, so that a negative modulated current I2 flows to the terminals T3 and T4. That is, the generated current I1 is code-modulated with "1".

On the other hand, when the control signal m3 indicates "0", and the control signal m4 indicates "1", the switches S21 and S24 are in the OFF state, and the switches S22 and S23 are in the ON state. At this point in time, a negative generated current I1 input to the code modulator 2 flows in the direction indicated by arrow B2 in FIG. 9, so that a positive modulated current I2 flows to the terminals T3 and T4. That is, the generated current I1 is code-modulated with "−1".

Accordingly, in the second half cycle, the code modulator 2 also outputs the modulated current I2 to the transmission path 3 via the terminals T3 and T4.

[3-2-3. Supplement]

The series of switching operations based on the control signals m1 to m4 illustrated in Table 3 corresponds to an operation for code-modulating the generated current I1 with a modulation code Mb given by:

$$Mb=[1\ -1\ 1\ 1\ 1\ -1\ -1\ 1\ -1\ 1\ 1\ 1\ -1\ -1] \quad (6)$$

In the modulation code Mb, the number of 1s is larger than the number of −1s. However, the average of the modulated current I2 can become 0. This is because the generated current I1 is positive in the first half cycle and is negative in the second half cycle, and a partial sequence of the modulation code Mb in the first half cycle and a partial sequence of the modulation code Mb in the second half cycle are the same.

[3-3. Operation of Code Demodulator]

A description will be given of the operation of the code demodulator 4.

[3-3-1. Operation of Code Demodulator in First Half Cycle]

In the first half cycle, the switches S11 to S14 are turned on or off in accordance with the control signals d1 and d2, and the switches S31 to S34 are maintained in the OFF state.

When a positive modulated current I2 is input to the code demodulator 4 in the first half cycle, the control signal d1 indicates "1", and the control signal d2 indicates "0". At this point in time, the switches S12 and S13 are in the ON state, and the switches S11 and S14 are in the OFF state. Thus, the positive modulated current I2 flows in the direction indicated by arrow C1 in FIG. 10, and a positive demodulated current I3 flows to the terminals T13 and T14. That is, the modulated current I2 is code-demodulated with "1".

In the first half cycle, when the negative modulated current I2 is input to the code demodulator 4, the control signal d1 indicates "0", and the control signal d2 indicates "1". At this point in time, the switches S12 and S13 are in the OFF state, and the switches S11 and S14 are in the ON state. Thus, a negative modulated current I2 flows in the direction indicated by arrow C1 in FIG. 10, and a positive demodulated current I3 flows to the terminals T13 and T14. That is, the modulated current I2 is code-demodulated with "−1".

Thus, the code demodulator 4 outputs the positive demodulated current I3 via the terminals T13 and T14 in the first half cycle.

[3-3-2. Operation of Code Demodulator in Second Half Cycle]

In the second half cycle, the switches S11 to S14 are maintained in the OFF state, and the switches S31 to S34 are turned on or off in accordance with the control signals d3 and d4.

In the second half cycle, when a positive modulated current I2 is input to the code demodulator 4, the control signal d3 indicates "1", and the control signal d4 indicates "0". At this point in time, the switches S32 and S33 are in the ON state, and the switches S31 and S34 are in the OFF state. Thus, the positive modulated current I2 flows in the direction indicated by arrow C2 in FIG. 10, and a negative demodulated current I3 flows to the terminals T13 and T14. That is, the modulated current I2 is code-demodulated with "−1".

In the second half cycle, when the negative modulated current I2 is input to the code demodulator 4, the control signal d3 indicates "0", and the control signal d4 indicates "1". At this point in time, the switches S32 and S33 are in the OFF state, and the switches S31 and S34 are in the ON state. Thus, a negative modulated current I2 flows in the direction indicated by arrow C2 in FIG. 10, and a negative demodulated current I3 flows to the terminals T13 and T14. That is, the modulated current I2 is code-demodulated with "1".

Accordingly, the code demodulator 4 outputs the negative demodulated current I3 via the terminals T13 and T14 in the second half cycle. In other words, the code demodulator 4 generates, as the demodulated current I3, an AC that is positive in the first half cycle and is negative in the second half cycle, and the waveform of the AC generally matches the waveform of the generated current I1.

[3-3-3. Supplement]

The series of switching operations based on the control signals d1 to d4 illustrated in Table 3 corresponds to an operation of code-demodulating the modulated current I2 with a demodulation code Db:

$$Db=[1\ -1\ 1\ 1\ 1\ -1\ -1\ 1\ -1\ 1\ 1\ 1\ -1\ -1] \quad (7)$$

[4. Modification of Operation]

Table 4 illustrates other examples of the code sequences of the control signals m1 to m4 input to the switches S1 to S4 and S21 to S24 in the code modulator 2 and other examples of the code sequences of the control signals d1 to d4 input to switches S11 to S14 and S31 to S34 in the code demodulator 4.

TABLE 4

| CONTROL SIGNAL | CODE SEQUENCE |
|---|---|
| m1 | [c1a c1b] = [10111000100011] |
| m2 | [c1b c1a] = [01000111011100] |
| m3 | [c0 c0] = [00000000000000] |
| m4 | [c0 c0] = [00000000000000] |
| d1 | [c1a c1b] = [10111000100011] |
| d2 | [c1b c1a] = [01000111011100] |
| d3 | [c0 c0] = [00000000000000] |
| d4 | [c0 c0] = [00000000000000] |

The control signals m3, m4, d3, and d4 illustrated in Table 4 maintain the switches S21 to S24 and S31 to S34 in the OFF state. Thus, the H-bridge circuit 23A illustrated in FIG. 9 and the H-bridge circuit 33A illustrated in FIG. 10 are the substantially the same as the H-bridge circuit 23 and the H-bridge circuit 33, respectively, illustrated in FIG. 7.

In addition, the control signals m1, m2, d1, and d2 illustrated in Table 4 are the same as the control signals m1, m2, d1, and d2 illustrated in Table 2. Thus, the code modulator 2 and the code demodulator 4 in this reference mode can realize DC-power modulation and demodulation like those described above in the first reference mode.

Accordingly, when the control signals are changed, the code modulator and the code demodulator according to this reference mode can deal with both DC-power modulation and demodulation and AC-power modulation and demodulation.

When the electric generator 1 generates DC power, it may be, for example, a photovoltaic generator. When the electric generator 1 generates AC power, it may be, for example, an electric generator utilizing turbine rotation. Examples of such an electric generator include a fossil-fuel power station, a hydropower station, a wind power generator, a nuclear power station, and a tidal power station.

[5. Modifications of Code Modulator and Code Demodulator]

Figure 11:
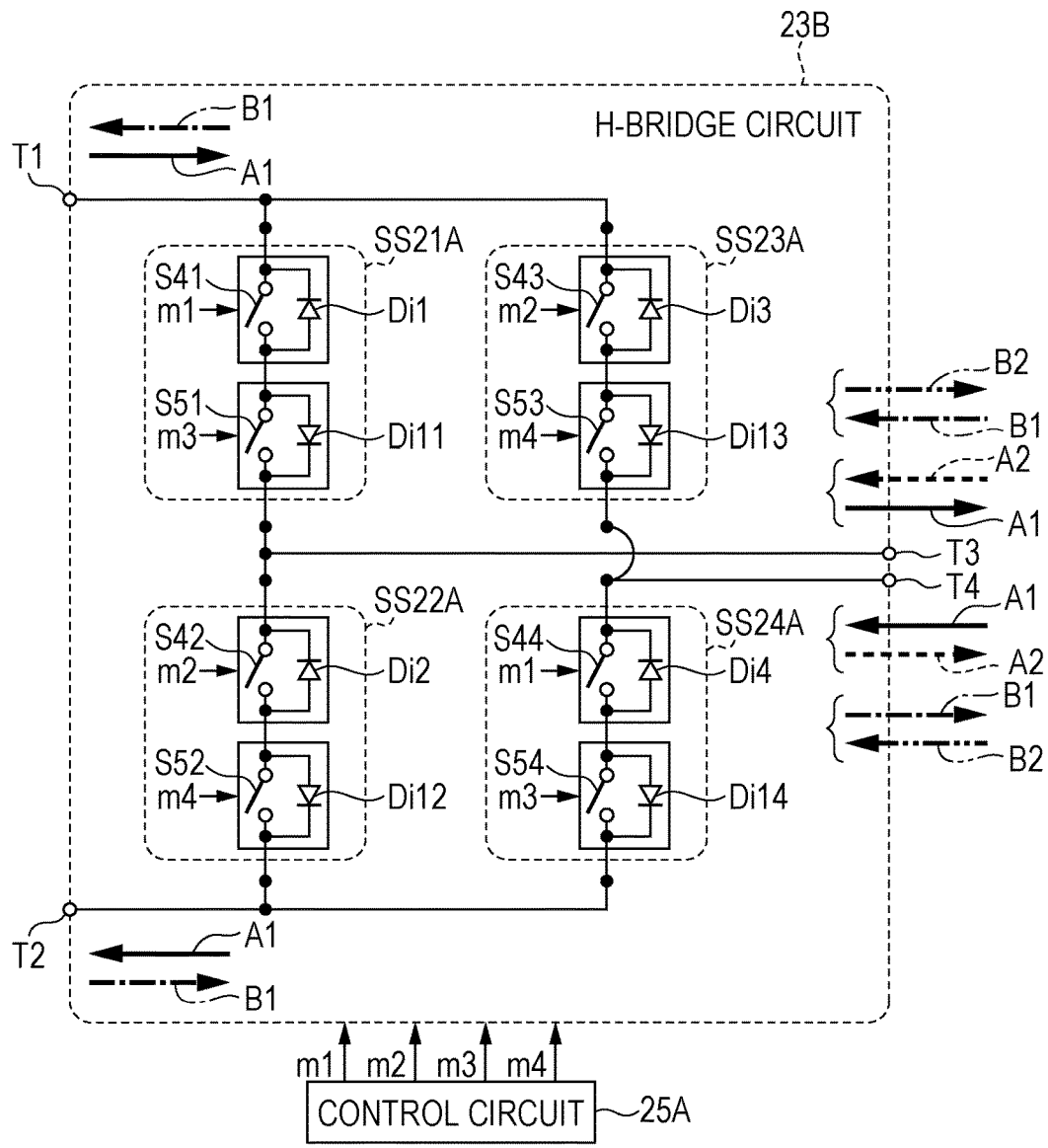
FIG. 11 is a schematic circuit diagram illustrating the configuration of a code modulator according to a modification of the second reference mode.

FIG. 11 illustrates a modification of an H-bridge circuit 23B in the code modulator 2 according to the second reference mode. The H-bridge circuit 23B illustrated in FIG. 11 includes bidirectional switch circuits SS21A to SS24A in place of the bidirectional switch circuits SS21 to SS24 illustrated in FIG. 9.

The bidirectional switch circuit SS21A includes switches S41 and S51 and diodes Di1 and Di11. The switches S41 and S51 are connected in series with each other. The diode Di1 is connected in parallel with the switch S41. The diode Di11 is connected in parallel with the switch S51. The diode Di1 passes current from a terminal T3 to a terminal T1. The diode Di11 passes current from the terminal T1 to the terminal T3. Since the bidirectional switch circuits SS22A to SS24A have structures that are the same as or similar to that of the bidirectional switch circuit SS21A, descriptions thereof are not given hereinafter.

The control circuit 25A outputs a control signal m1 to the switches S41 and S44, outputs a control signal m2 to the switches S42 and S43, outputs a control signal m3 to the switches S51 and S54, and outputs a control signal m4 to the switches S52 and S53. The control signals m1 to m4 may be, for example, the control signals illustrated in Table 3.

Figure 12:
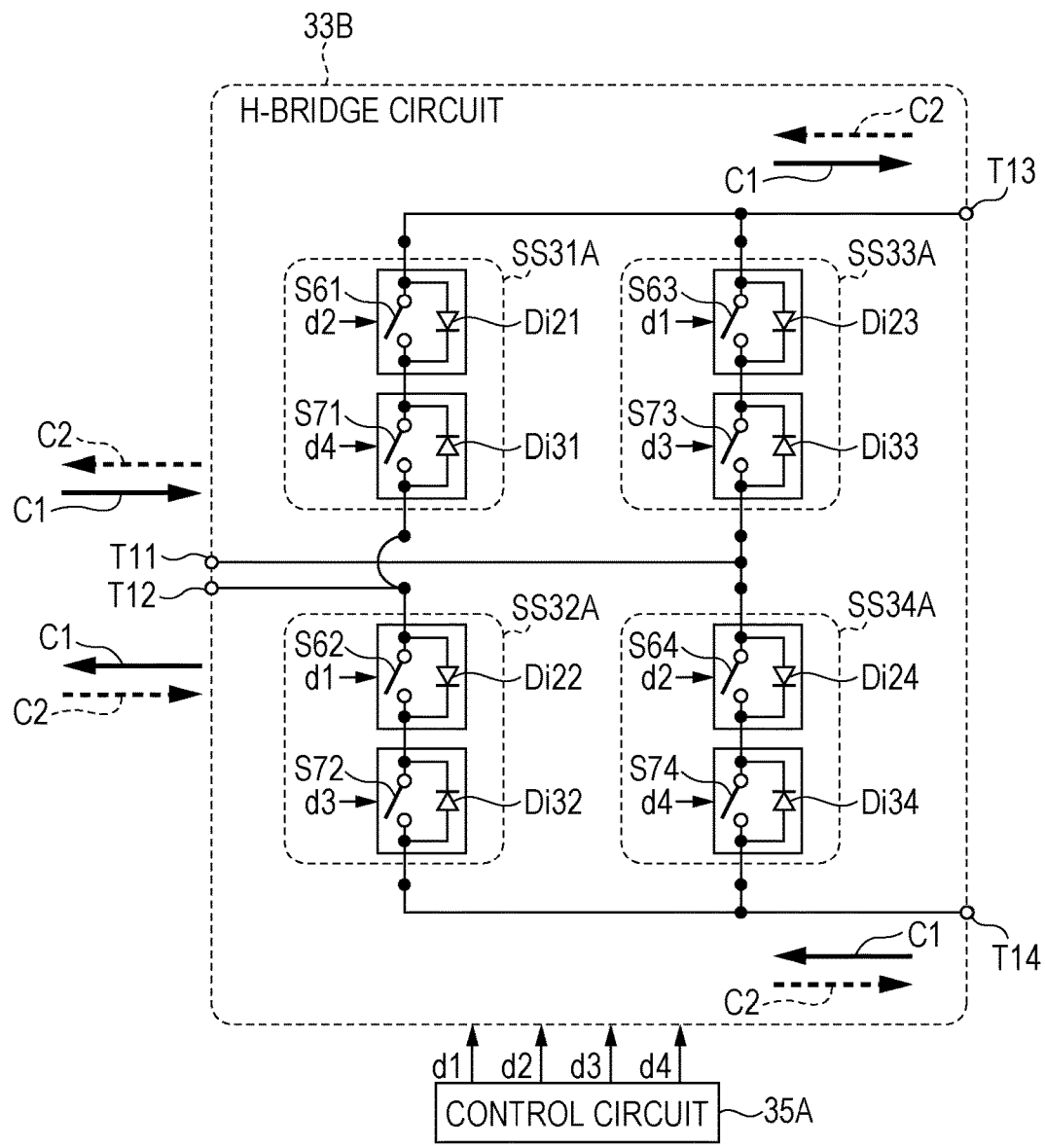
FIG. 12 is a schematic circuit diagram illustrating the configuration of a code demodulator according to a modification of the second reference mode.

FIG. 12 illustrates a modification of an H-bridge circuit 33B in the code demodulator 4 according to the second reference mode. The H-bridge circuit 33B illustrated in FIG. 12 includes bidirectional switch circuits SS31A to SS34A in place of the bidirectional switch circuits SS31 to SS34 illustrated in FIG. 10.

The bidirectional switch circuit SS31A includes switches S61 and S71 and diodes Di21 and Di31. The switches S61 and S71 are connected in series with each other. The diode Di21 is connected in parallel with the switch S61. The diode Di31 is connected in parallel with the switch S71. The diode Di21 passes current from a terminal T13 to a terminal T12. The diode Di31 passes current from the terminal T12 to the terminal T13. Since bidirectional switch circuits SS32A to SS34A have structures that are same as or similar to that of the bidirectional switch circuit SS31A, descriptions thereof are not given hereinafter.

The control circuit 35A outputs a control signal d1 to switches S62 and S63, outputs a control signal d2 to the switches S61 and S64, outputs a control signal d3 to switches S72 and S73, and outputs a control signal d4 to the switches S71 and S74. The control signals d1 to d4 may be, for example, those illustrated in Table 3.

The switches S41 to S44, S51 to S54, S61 to S64, and S71 to S74 may be, for example, MOS transistors. In this case, the diodes Di1 to Di4, Di11 to Di14, Di21 to Di24, and Di31 to Di34 may be, for example, body diodes of the MOS transistors. This makes it possible to miniaturize the bidirectional switches SS21A to SS24A and SS31A to SS34A.

Third Reference Mode

A power transmission system according to a third reference mode is substantially the same as the power transmission system 100 described above in the first reference mode and/or the second reference mode, except that DC-AC conversion or AC-DC conversion is performed. The following description will be given of the third reference mode, particularly, points that are different from the first and second reference modes.

[1. Code Modulation and Demodulation Involving DC-AC Conversion]

In a first example operation of the third reference mode, a DC was code-modulated, and then the code-modulated current was converted into a predetermined AC.

In this example operation, control signals m1 to m4 for the code modulator 2 had the code sequences illustrated in Table 4 described above, and control signals d1 to d4 for the code demodulator 4 had the code sequences illustrated in Table 3 described above.

Figure 13A:
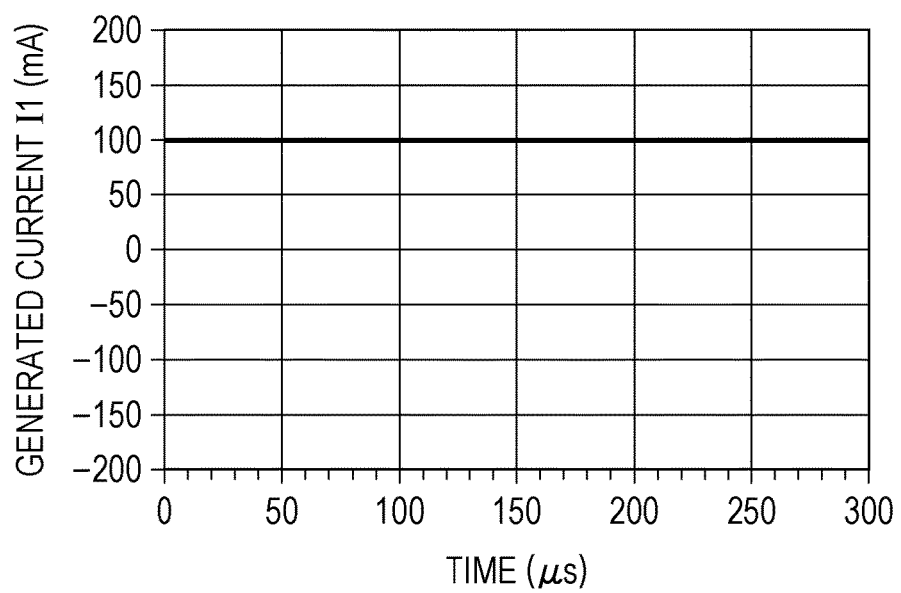
FIG. 13A is a graph illustrating the waveform of a generated current according to a first example operation of a third reference mode.
Figure 13B:
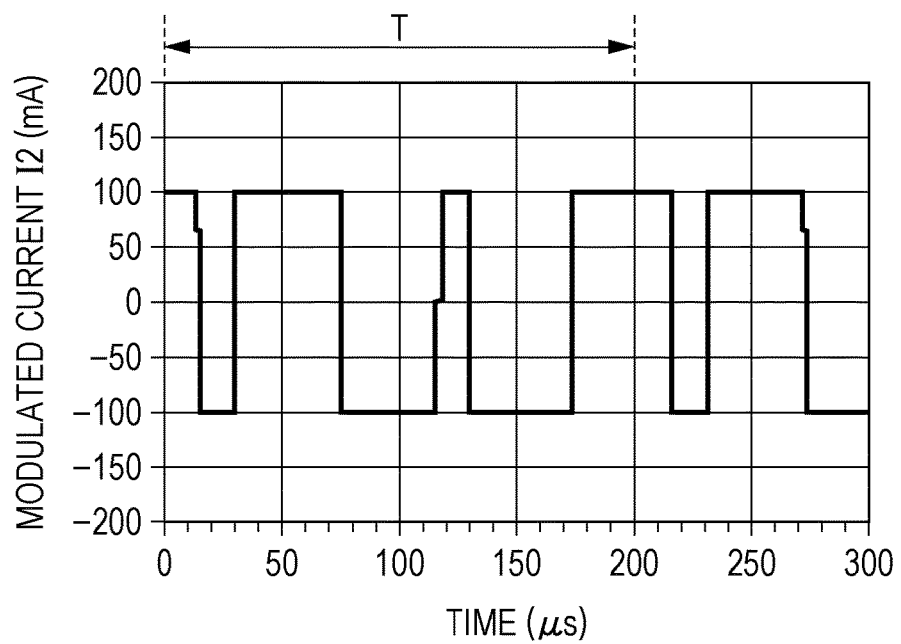
FIG. 13B is a graph illustrating the waveform of a modulated current according to the first example operation of the third reference mode.
Figure 13C:
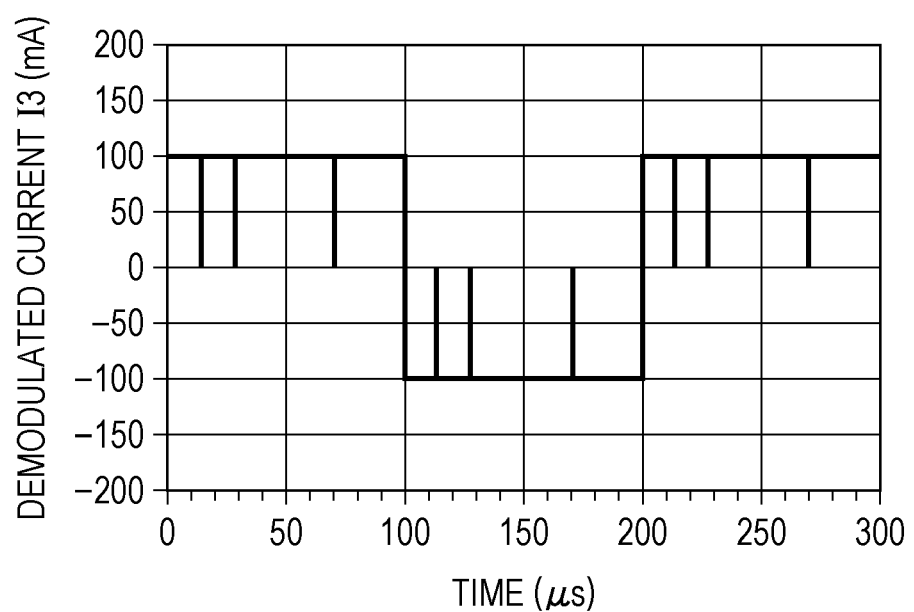
FIG. 13C is a graph illustrating the waveform of a demodulated current according to the first example operation of the third reference mode.

FIGS. 13A to 13C illustrate the waveforms of a generated current I1, a modulated current I2, and a demodulated current I3, respectively, according to this example operation. The cycle of the demodulated current I3 was twice the time span of the code sequences c1a, c1b, and c0. Comparison between FIG. 13A and FIG. 13C shows that the DC generated current I1 was converted into the AC demodulated current I3 through the code modulation and demodulation.

The "demodulation" used in the present disclosure is not limited to restoring pre-modulation power from the code-modulated power. The "demodulation" may be, for example, a predetermined conversion operation such as code-demodulating the code-modulated power and further reversing the polarity thereof partially and periodically.

[2. Code Modulation and Demodulation Involving AC-DC Conversion]

In a second example operation of the third reference mode, an AC was code-modulated, and then the code-modulated current was converted into a predetermined current.

In this example operation, control signals m1 to m4 for the code modulator 2 had the code sequences illustrated in Table 3 described above, and control signals d1 to d4 for the code demodulator 4 had the code sequences illustrated in Table 4 described above.

Figure 14A:
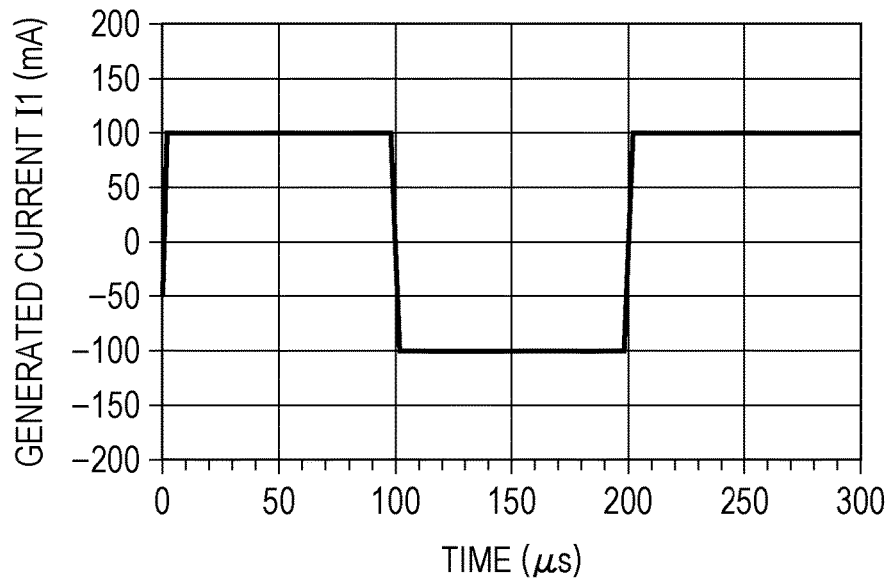
FIG. 14A is a graph illustrating the waveform of a generated current according to a second example operation of the third reference mode.
Figure 14B:
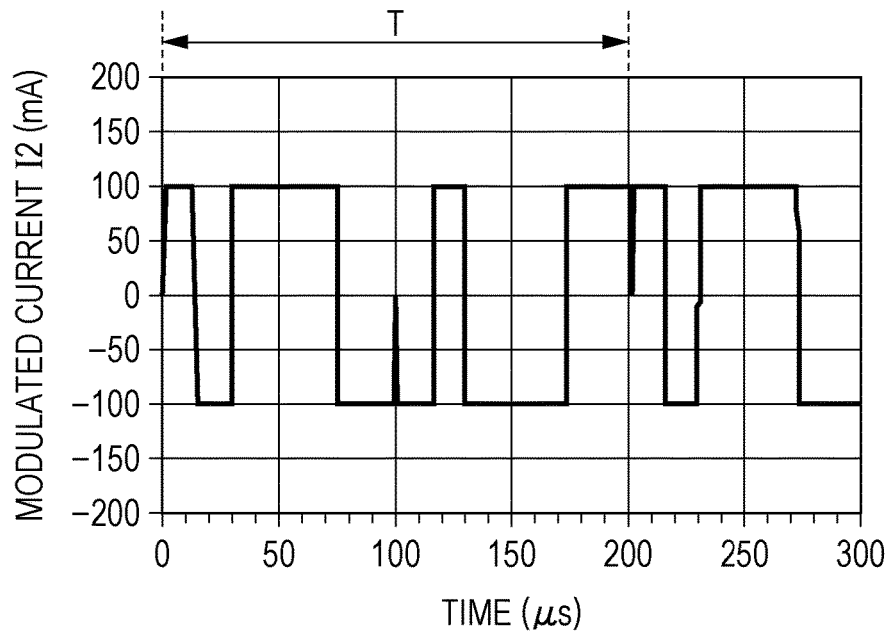
FIG. 14B is a graph illustrating the waveform of a modulated current according to the second example operation of the third reference mode.
Figure 14C:
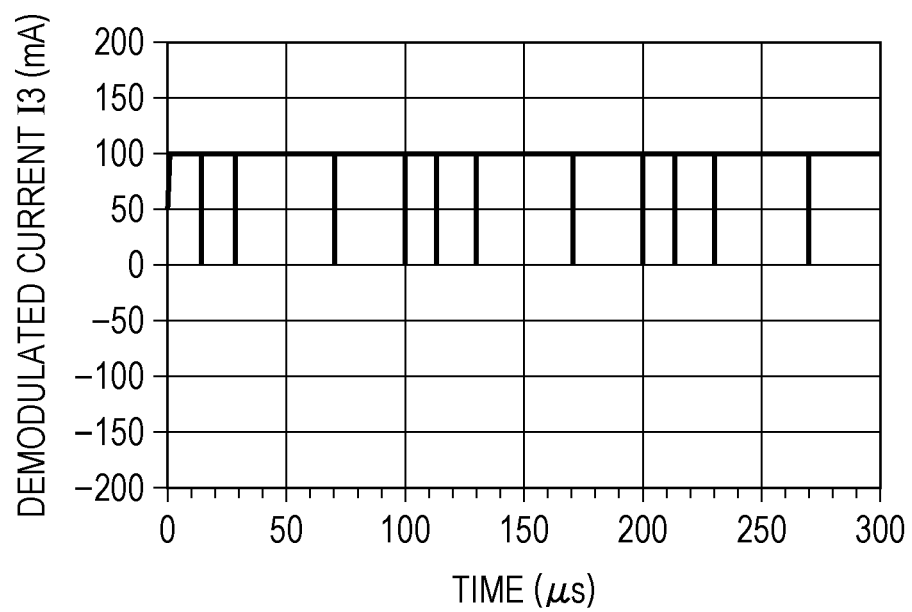
FIG. 14C is a graph illustrating the waveform of a demodulated current according to the second example operation of the third reference mode.

FIGS. 14A to 14C illustrate the waveforms of a generated current I1, a modulated current I2, and a demodulated current I3, respectively, according to this example operation. The cycle of the generated current I1 was twice the time span of the code sequences c1a, c1b, and c0. Comparison between FIG. 14A and FIG. 14C shows that the AC generated current I1 was converted into the DC demodulated current I3 through the code modulation and demodulation.

Fourth Reference Mode

[1. Power Transmission System]

Figure 15:
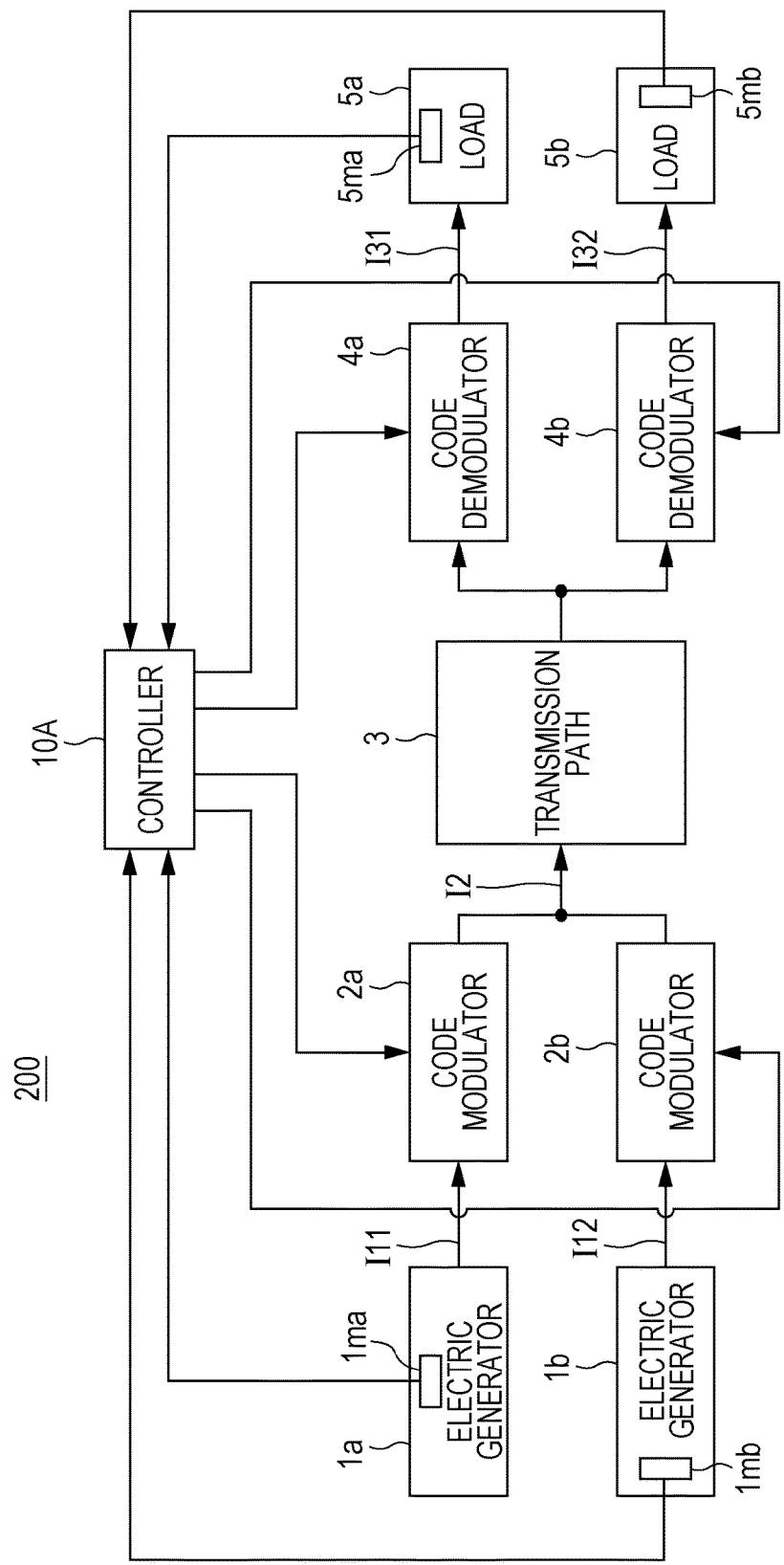
FIG. 15 is a block diagram illustrating an example configuration of a power transmission system according to a fourth reference mode.
Figure 16A:
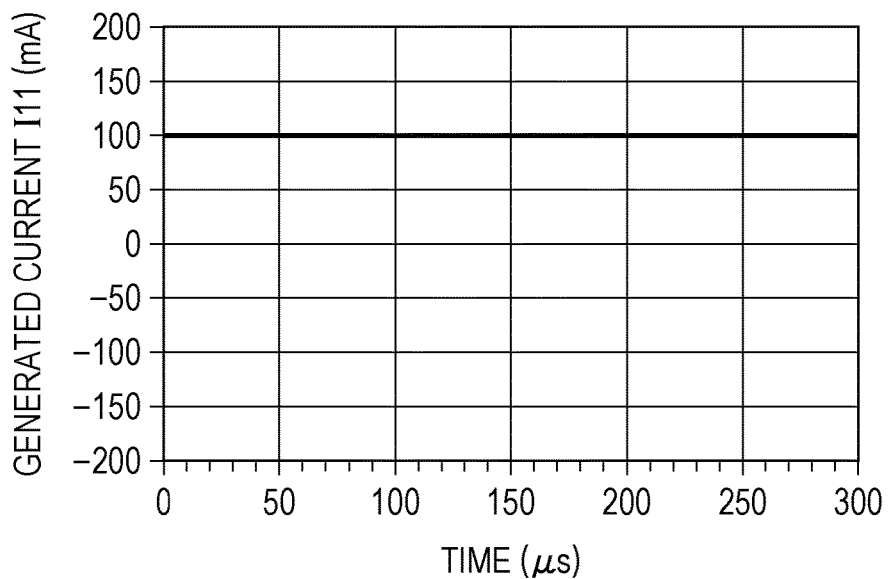
FIG. 16A is a graph illustrating the waveform of a first generated current according to a first example operation of the fourth reference mode.
Figure 16B:
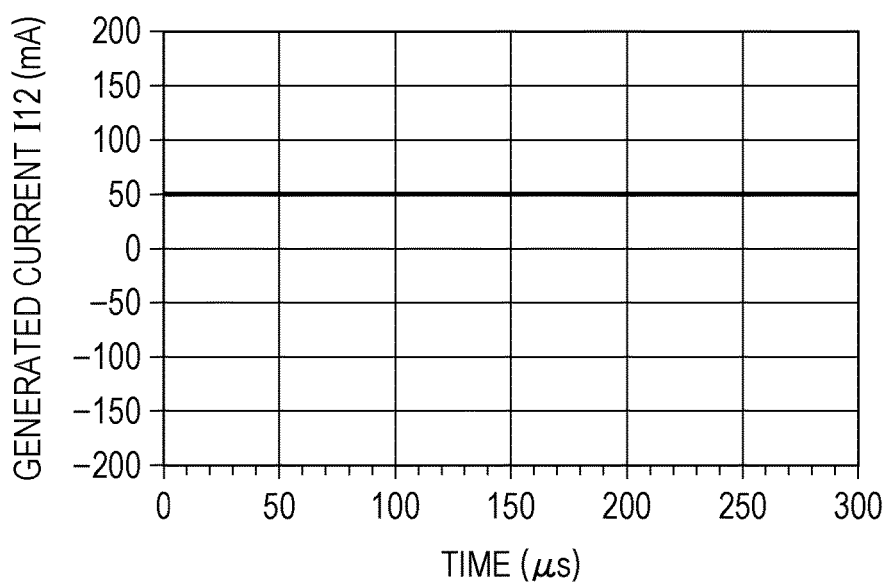
FIG. 16B is a graph illustrating the waveform of a second generated current according to the first example operation of the fourth reference mode.
Figure 16C:
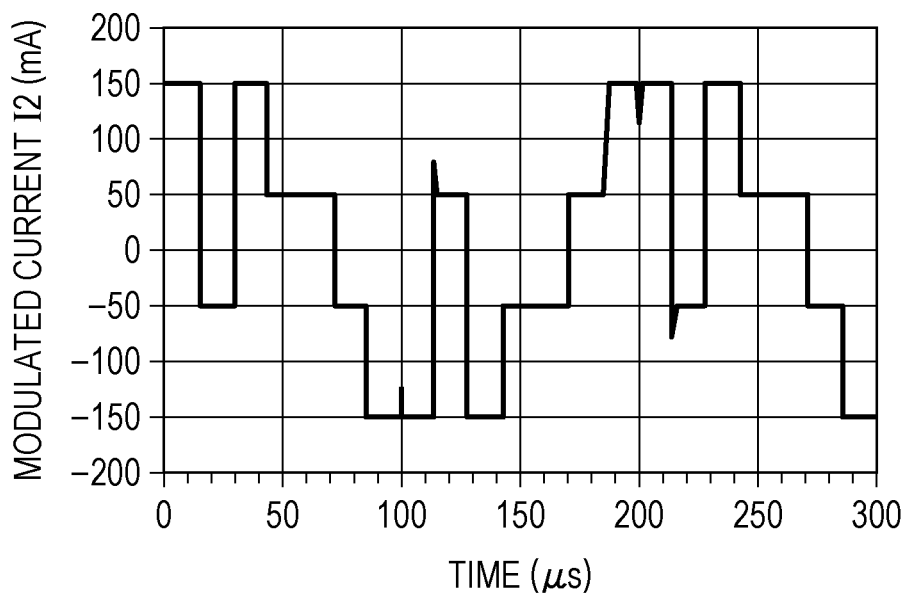
FIG. 16C is a graph illustrating the waveform of a modulated current according to the first example operation of the fourth reference mode.
Figure 16D:
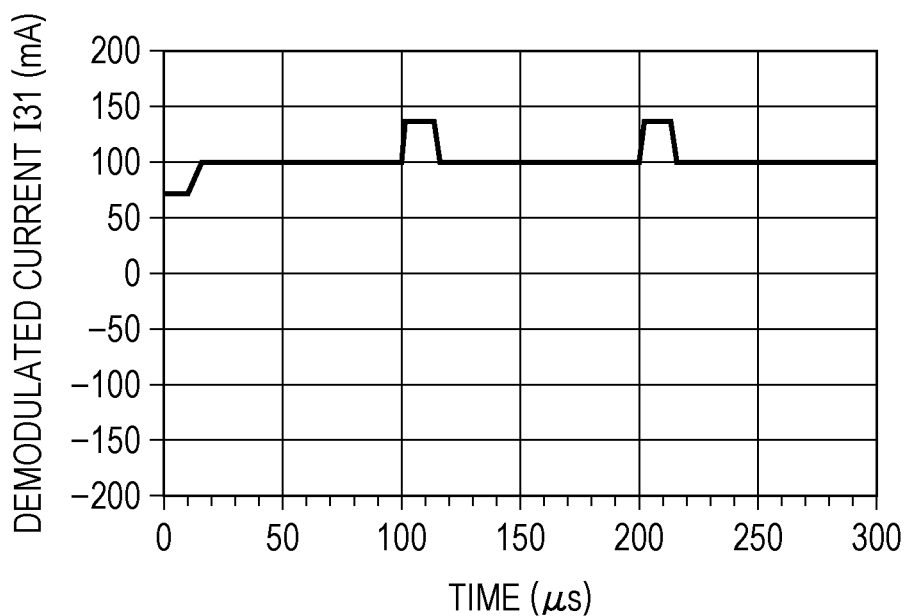
FIG. 16D is a graph illustrating the waveform of a first demodulated current according to the first example operation of the fourth reference mode.
Figure 16E:
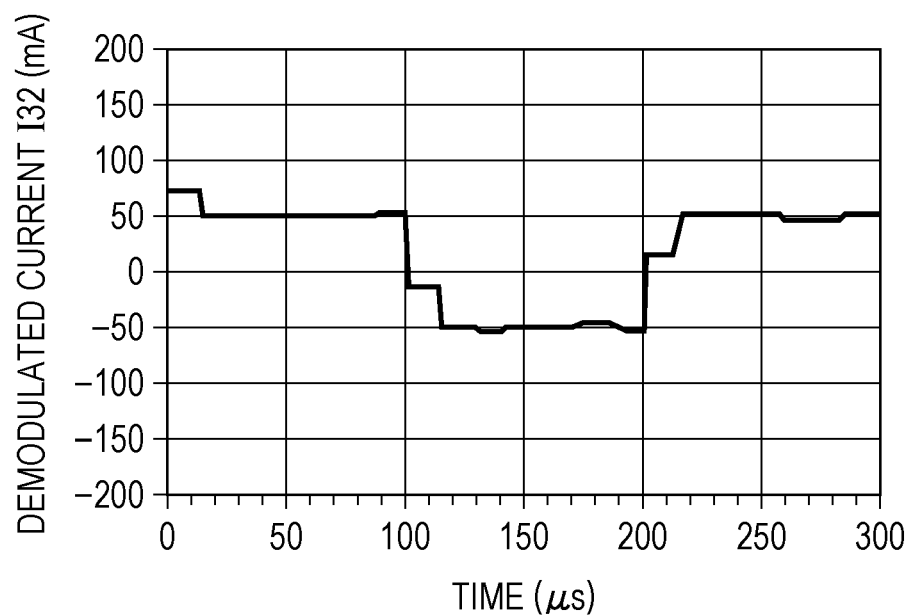
FIG. 16E is a graph illustrating the waveform of a second demodulated current according to the first example operation of the fourth reference mode.
Figure 17A:
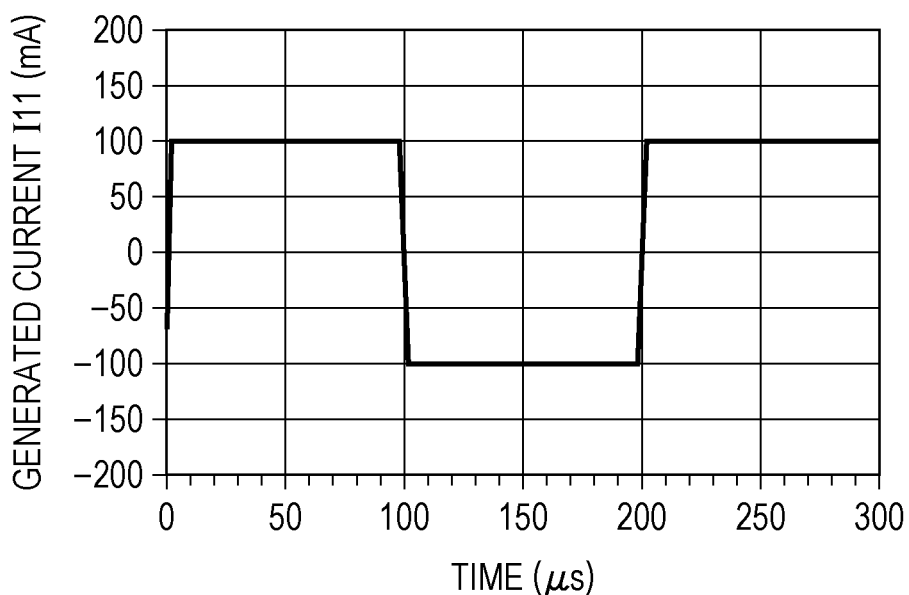
FIG. 17A is a graph illustrating the waveform of a first generated current according to a second example operation of the fourth reference mode.
Figure 17B:
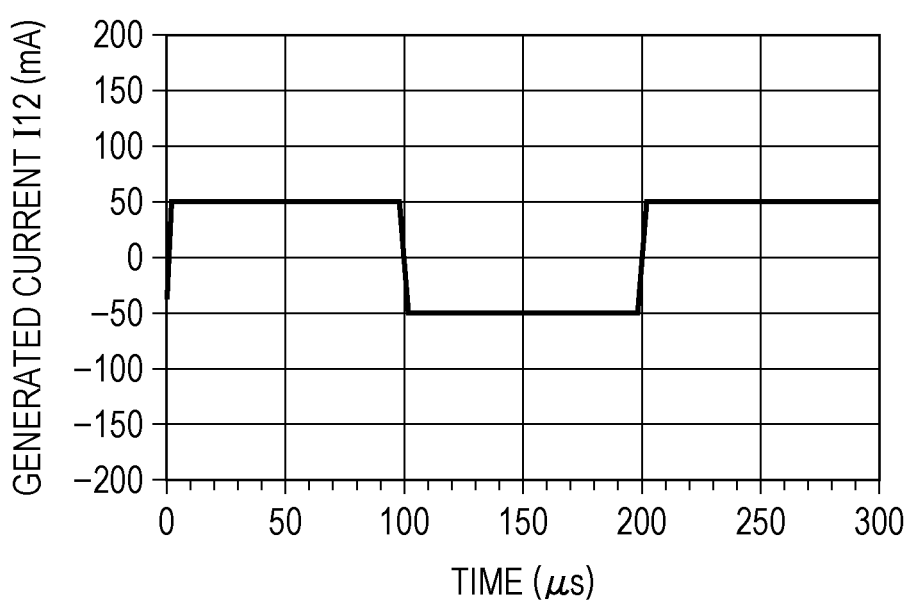
FIG. 17B is a graph illustrating the waveform of a second generated current according to the second example operation of the fourth reference mode.
Figure 17C:
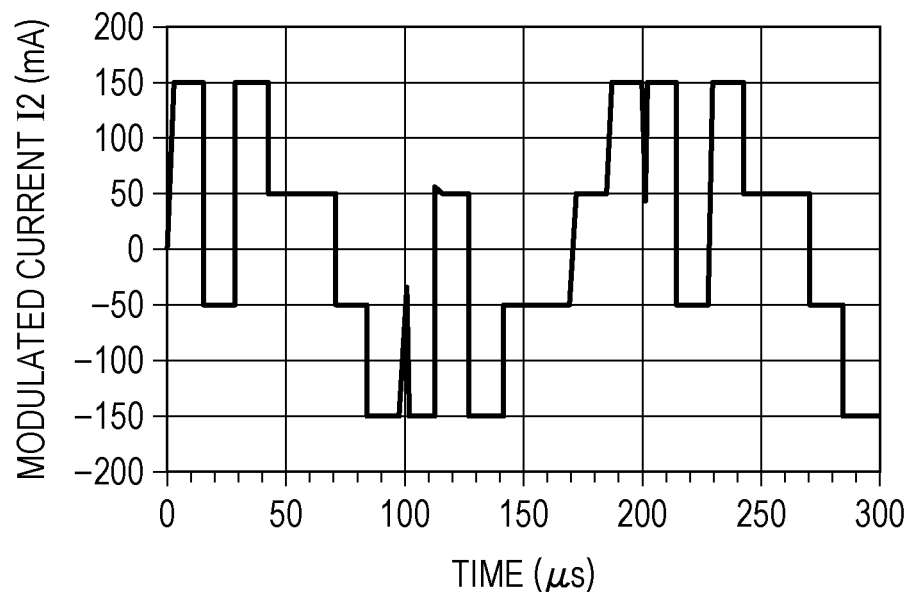
FIG. 17C is a graph illustrating an example waveform of a modulated current according to the second example operation of the fourth reference mode.
Figure 17D:
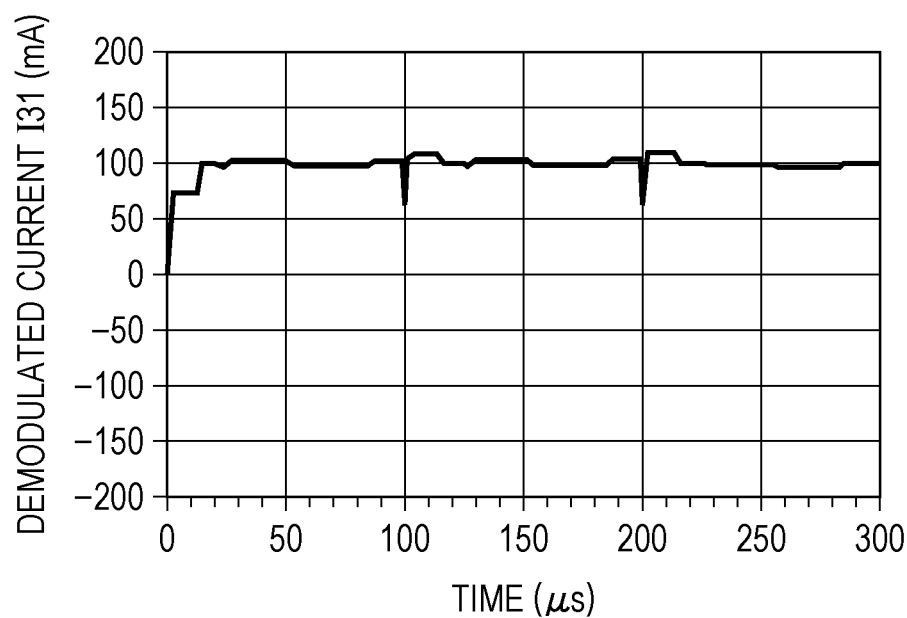
FIG. 17D is a graph illustrating the waveform of a first demodulated current according to the second example operation of the fourth reference mode.
Figure 17E:
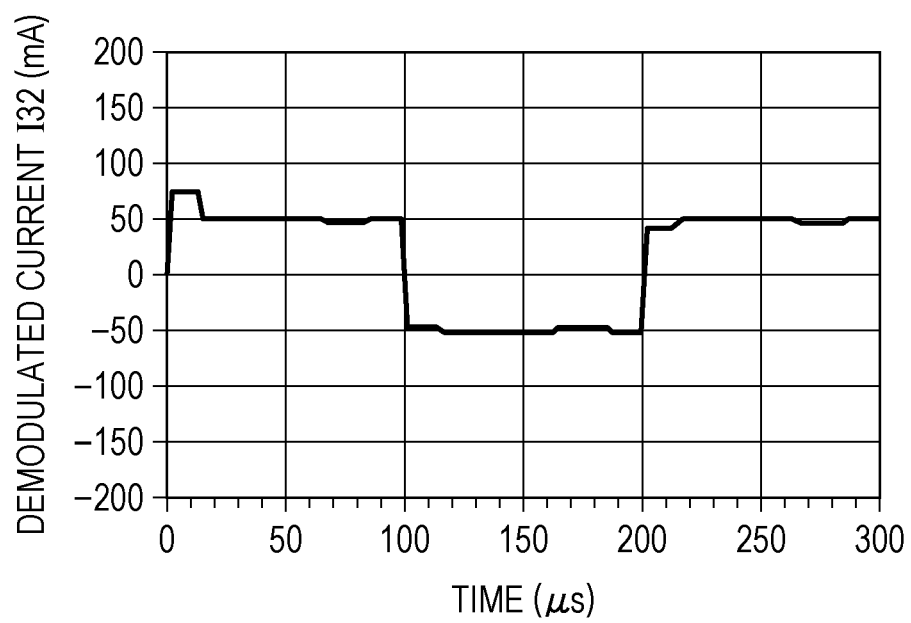
FIG. 17E is a graph illustrating the waveform of a second demodulated current according to the second example operation of the fourth reference mode.

FIG. 15 illustrates an example configuration of a power transmission system 200 according to a fourth reference mode.

The power transmission system 200 includes electric generators 1a and 1b, code modulators 2a and 2b, a transmission path 3, code demodulators 4a and 4b, loads 5a and 5b, and a controller 10A.

Although, in the example illustrated in FIG. 15, the power transmission system 200 includes two electric generators 1a and 1b and two loads 5a and 5b, the number of electric generators and the number of loads are not limited thereto. The power transmission system 200 may include three or more electric generators and three or more loads.

The controller 10A obtains, from power measuring instruments 1ma and 1mb, information about the amounts of electricity generated by the electric generators 1a and 1b and obtains, from power measuring instrument 5ma and 5mb, information about the amounts of power consumed by the loads 5a and 5b. On the basis of those pieces of information, the controller 10A controls the code modulators 2a and 2b and the code demodulators 4a and 4b.

For example, the controller 10A may obtain information about instantaneous power in the code modulators 2a and 2b and/or the code demodulators 4a and 4b. This makes it possible to determine how much power is transmitted through a particular route. For example, when the power-generating cost differs from one electric generator to another or the power transmission efficiency differs depending on a power transmission route, it is possible to realize power supply corresponding to each electric generator or the power transmission route. In addition, an electricity charge corresponding to each electric generator or the power transmission route may be calculated in accordance with the obtained information.

The code modulator 2a code-modulates the power generated by the electric generator 1a and outputs the modulated power to the transmission path 3. The code modulator 2b code-modulates the power generated by the electric generator 1b and outputs the modulated power to the transmission path 3. The modulated power output from the code modulator 2a and the modulated power output from the code modulator 2b are combined together, and the resulting power is transmitted to the code demodulators 4a and 4b through the transmission path 3. The code demodulator 4a code-demodulates the power code-modulated by the code modulator 2a and outputs the demodulated power to the load 5a. The code demodulator 4b code-demodulates the power code-modulated by the code modulator 2b and outputs the demodulated power to the load 5b.

With this arrangement, the power transmission from the electric generator 1a to the load 5a and the power transmission from the electric generator 1b to the load 5b are concurrently and independently executed through the same transmission path 3.

Since the different powers are transmitted through the same transmission path 3, the transmission path 3 can be simplified. For example, when the transmission path 3 is a cable, it is possible to reduce the number of cables.

Since the modulated powers are combined together and are concurrently transmitted, for example, the transmission time can be reduced compared with a scheme in which powers in a plurality of channels are transmitted in a time-division manner. In addition, according to the code modulation and demodulation scheme, since each power is transmitted independently, the power transmission can be performed without affecting transmission of the other power.

Each of the code modulators 2a and 2b can execute code modulation through use of arbitrary modulation codes. Similarly, each of the code demodulators 4a and 4b can execute code demodulation through use of arbitrary demodulation codes. Accordingly, pairing between the code modulators and the code demodulators can be flexibly changed in accordance with an arbitrary combination of modulation codes and demodulation codes. For example, in FIG. 15, power transmission from the electric generator 1a to the load 5b and power transmission from the electric generator 1b to the load 5a may be executed concurrently. Even when the number of pairing patterns increases, an increase in the circuit scale is suppressed. Accordingly, it is possible to realize power transmission with an apparatus having a reduced size.

[2. Operation]

[2-1. Code Modulation and Demodulation of Plurality of DC Powers]

A case in which DC powers are output by the electric generators 1a and 1b, DC power is input to the load 5a, and AC power is input to the load 5b will be described as a first example operation of the fourth reference mode.

In this example operation, control signals m1 to m4 for the code modulator 2a and control signals d1 to d4 for the code demodulator 4a had the code sequences illustrated in Table 4 described above, and control signals m1 to m4 for the code modulator 2b and control signals d1 to d4 for the code demodulator 4b had code sequences illustrated in Table 5 below.

TABLE 5

| CONTROL SIGNAL | CODE SEQUENCE |
|---|---|
| m1 | [c2a c2b] = [11100100001101] |
| m2 | [c2b c2a] = [00011011110010] |
| m3 | [c0 c0] = [00000000000000] |
| m4 | [c0 c0] = [00000000000000] |
| d1 | [c2a c0] = [11100100000000] |
| d2 | [c2b c0] = [00011010000000] |
| d3 | [c0 c2a] = [00000001110010] |
| d4 | [c0 c2b] = [00000000001101] |

The code sequence c1a and a code sequence c2a were different from each other, and the code sequence c1b and a code sequence c2b were different from each other. The code sequence c1a and the code sequence c2a were orthogonal to each other, and the code sequence c1b and the code sequence c2b were orthogonal to each other. More specifically, the code sequence c1a and the code sequence c2a were 7-bit orthogonal Gold sequences different from each other, and the code sequence c1b and the code sequence c2b were 7-bit orthogonal Gold sequences different from each other.

FIGS. 16A to 16E illustrate the waveforms of a generated current I11, a generated current I12, a modulated current I2, a demodulated current I31, and a demodulated current I32, respectively, in this example operation. As illustrated in FIGS. 16A to 16E, the DC power from the electric generator 1a was supplied to the load 5a, and the DC power from the electric generator 1b was converted into AC power, which was supplied to the load 5b.

[2-2. Code Modulation and Demodulation of Plurality of AC Powers]

A case in which AC powers are output by the electric generators 1a and 1b, DC power is input to the load 5a, and AC power is input to the load 5b will be described as a second example operation of the fourth reference mode.

In this example operation, control signals m1 to m4 for the code modulator 2a had the code sequences illustrated in Table 3 described above, control signals d1 to d4 for the code demodulator 4a had the code sequences illustrated in Table 4 described above, and control signals m1 to m4 for the code modulator 2b and control signals d1 to d4 for the code demodulator 4b had code sequences illustrated in Table 6 below.

TABLE 6

| CONTROL SIGNAL | CODE SEQUENCE |
|---|---|
| m1 | [c2a c0] = [11100100000000] |
| m2 | [c2b c0] = [00011010000000] |
| m3 | [c0 c2a] = [00000001110010] |
| m4 | [c0 c2b] = [00000000001101] |
| d1 | [c2a c0] = [11100100000000] |
| d2 | [c2b c0] = [00011010000000] |
| d3 | [c0 c2a] = [00000001110010] |
| d4 | [c0 c2b] = [00000000001101] |

FIGS. 17A to 17E illustrate the waveforms of a generated current I11, a generated current I12, a modulated current I2, a demodulated current I31, and a demodulated current I32, respectively, in this example operation. As illustrated in FIGS. 17A to 17E, AC power from the electric generator 1a was converted into DC power, which was supplied to the load 5a, and AC power from supply the electric generator 1b was supplied to the load 5b.

First Embodiment

[1. Power Transmission System]

A power transmission system according to a first embodiment is substantially the same as the power transmission system 100 described above in the second reference mode, except for details of control on the code modulator 2 and the code demodulator 4. For example, the power transmission system according to the first embodiment is substantially the same as the power transmission system 100 described above in the second reference mode, except for a memory to which a program for controlling the code modulator 2 and the code demodulator 4 is recorded.

In the present embodiment, the code modulator 2 code-modulates first AC power having a first frequency to generate code-modulated power. In the present embodiment, the code demodulator 4 demodulates the code-modulated power to generate second AC power having a second frequency that is higher than the first frequency. In other words, the code demodulator 4 generates second AC power from the code-modulated power by using a conversion code for executing code demodulation and frequency multiplication at a time. In the present disclosure, such a conversion code may be referred to as a "demodulation code" for simplification. The "demodulation code" described in the present embodiment is an example of a "conversion code" in the present disclosure.

For example, the power measuring instrument 1m transmits, to the controller 10A, information about the amount and the frequency (i.e., the first frequency) of the power generated by the electric generator 1. The power measuring instrument 5m transmits, to the controller 10A, information about the amount and the frequency (i.e., the second frequency) of power which are requested by the load 5. On the basis of those pieces of information, the controller 10A controls the code modulator 2 and the code demodulator 4.

[2. Operation]

[2-1. First Example Operation]

An example in which the code modulator 2 generates code-modulated power from first AC power having a first frequency, and the code demodulator 4 generates, from the code-modulated power, second AC power having a second frequency obtained by doubling the first frequency will now be described as a first example operation of the first embodiment.

FIG. 18 illustrates the waveforms of a generated current I1 and a demodulated current I3 in this example operation.

In FIG. 18, the cycle of the generated current I1 is Ts [second], and the frequency thereof is fs [Hz] (=1/Ts). The cycle f the demodulated current I3 is Tr [second], and the frequency thereof is fr [Hz] (=1/Tr). Tc [second] is the cycle of a partial sequence (described below) included in a modulation code and a demodulation code.

Table 7 illustrates code sequences of control signals m1 to m4 input to the code modulator 2 and code sequences of control signals d1 to d4 input to the code demodulator 4. The code sequences of the control signals m1 to m4 and the code sequences of the control signals d1 to d4 include partial sequences c1a, c1b, and c0. The partial sequences c1a and c1b are orthogonal code sequences as illustrated in Table 1 described above, and the partial sequence c0 is a zero sequence.

TABLE 7

| CONTROL SIGNAL | CODE SEQUENCE |
|---|---|
| m1 | [c1a c1a c0 c0] |
| m2 | [c1b c1b c0 c0] |
| m3 | [c0 c0 c1a c1a] |
| m4 | [c0 c0 c1b c1b] |
| d1 | [c1a c0 c1b c0] |
| d2 | [c1b c0 c1a c0] |
| d3 | [c0 c1b c0 c1a] |
| d4 | [c0 c1a c0 c1b] |

In this example operation, the cycle Tc illustrated in FIG. 18 corresponds to the duration of each of the partial sequences c1a and c1b. In FIG. 18, the cycle Ts of the generated current I1 is four times the cycle Tc of each partial sequence, and the cycle Tr of the demodulated current I3 is twice the cycle Tc of each partial sequence. That is, the cycle Ts of the generated current I1 is twice the cycle Tr of the demodulated current I3. In other words, the frequency fr of the demodulated current I3 is twice the frequency fs of the generated current I1.

The series of switching operations based on the control signals m1 to m4 illustrated in Table 7 corresponds to an operation for code-modulating the generated current I1 with a modulation code Mc below. Also, the series of switching operation based on the control signals d1 to d4 illustrated in Table 7 corresponds to an operation for code-demodulating the modulated current I2 with a demodulation code Dc below.

$Mc=[C1\ C1\ C1\ C1]$ $Dc=[C1\ C2\ C2\ C1]$ $C1=[1\ -1\ 1\ 1\ 1\ -1\ -1],\ C2=[-1\ 1\ -1\ -1\ -1\ 1\ 1]$ (8)

As illustrated in Table 7, in the first quarter of the cycle Ts of the generated current I1, the control signals m1 to m4 input to the code modulator 2 and the control signals d1 to d4 input to the code demodulator 4 match each other. In other words, in the first quarter, the partial sequence C1 in the modulation code Mc and the partial sequence C1 in the demodulation code Dc match each other. Thus, in the first quarter, a positive generated current I1 is restored as a positive demodulated current I3.

As illustrated in Table 7, in the second quarter of the cycle Ts of the generated current I1, the control signals m1 to m4 input to the code modulator 2 and the control signals d1 to d4 input to the code demodulator 4 differ from each other. In the second quarter, however, the bit values of the partial sequence C2 of the demodulation code Dc correspond to values obtained by inverting the corresponding bit values of the partial sequence C1 in the modulation code Mc. Thus, in the second quarter, a positive generated current I1 is converted into a negative demodulated current I3.

As illustrated in Table 7, in the third quarter of the cycle Ts of the generated current I1, the control signals m1 to m4 input to the code modulator 2 and the control signals d1 to d4 input to the code demodulator 4 differ from each other. In the third quarter, however, the bit values of the partial sequence C2 of the demodulation code Dc correspond to values obtained by inverting the corresponding bit values of the partial sequence C1 in the modulation code Mc. Thus, in the third quarter, a negative generated current I1 is converted into a positive demodulated current I3.

As illustrated in Table 7, in the fourth quarter of the cycle Ts of the generated current I1, the control signals m1 to m4 input to the code modulator 2 and the control signals d1 to d4 input to the code demodulator 4 match each other. In other words, in the fourth quarter, the partial sequence C1 in the modulation code Mc and the partial sequence C1 in the demodulation code Dc match each other. Thus, in the fourth quarter, a negative generated current I1 is restored as a negative demodulated current I3.

Through the above-described operations, the demodulated current I3 changes by two cycles, while the generated current I1 changes by one cycle, as illustrated in FIG. 18. That is, the demodulated current I3 having a frequency obtained by doubling the frequency of the generated current I1 is generated.

In the present embodiment, of the partial sequences that constitute a demodulation code, a partial sequence in which individual bit values of the demodulation code take the same values as corresponding bit values of the modulation code may be referred to as a "first partial sequence". Of partial sequences that constitute a demodulation code, a partial sequence in which individual bit values of the demodulation code take values obtained by inverting corresponding bit values of the modulation code may be referred to as a "second partial sequence". In the demodulation code in this example operation, each partial sequence C1 in the first and fourth quarters of the cycle Ts of the generated current corresponds to the first partial sequence, and each partial sequence C2 in the second and third quarters of the cycle Ts of the generated current corresponds to the second partial sequence.

[2-2. Second Example Operation]

An example in which the code modulator 2 generates code-modulated power from first AC power having a first frequency, and the code demodulator 4 generates, from the code-modulated power, second AC power having a second frequency obtained by quadrupling the first frequency will now be described as a second example operation of the first embodiment.

Figure 19:
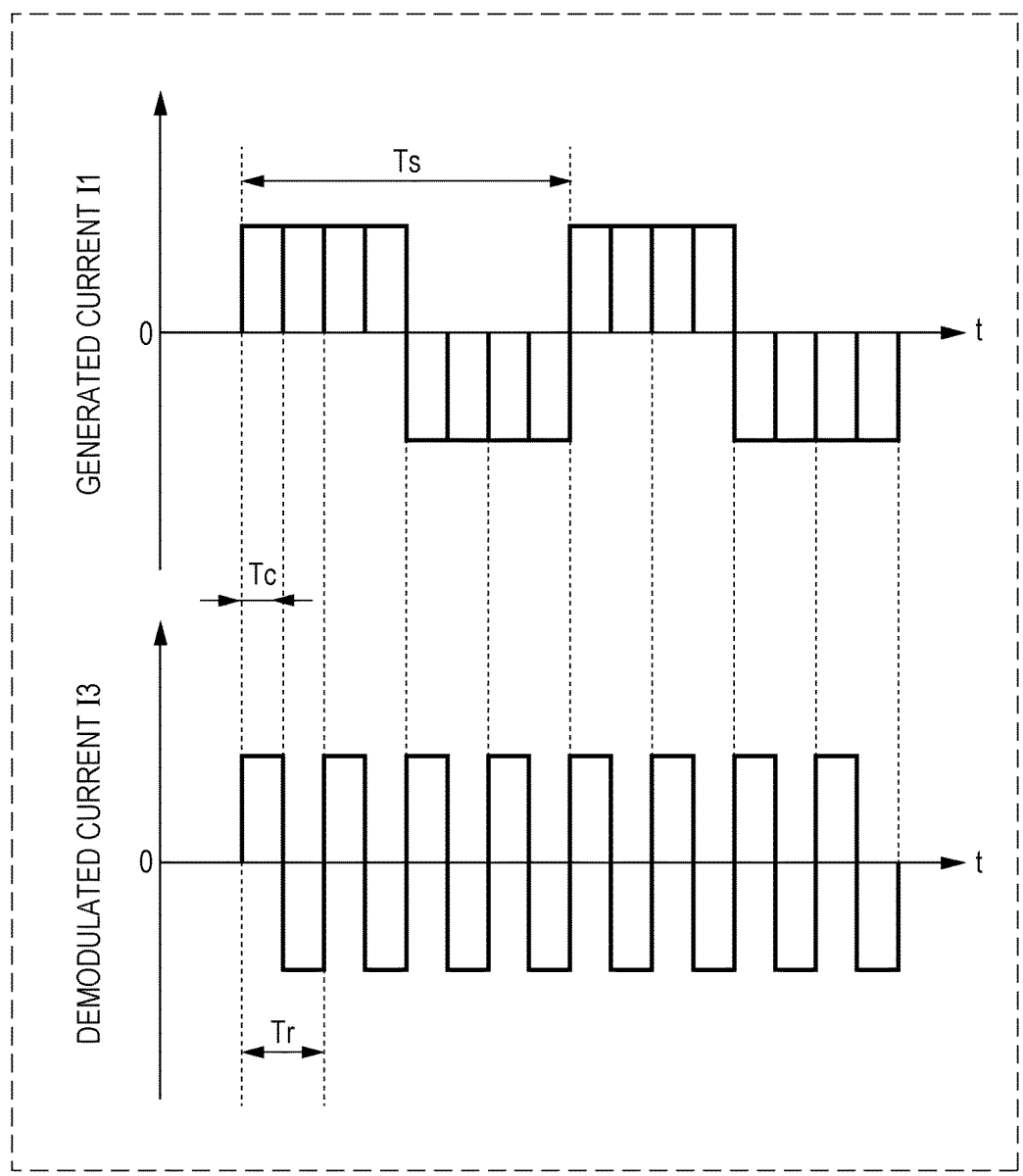
FIG. 19 is a diagram illustrating the waveforms of a generated current and a demodulated current according to a second example operation of the first embodiment.

FIG. 19 illustrates the waveforms of a generated current I1 and a demodulated current I3 in this example operation.

Table 8 illustrates code sequences of control signals m1 to m4 input to the code modulator 2 and code sequences of control signals d1 to d4 input to the code demodulator 4. The code sequences of the control signals m1 to m4 and the code sequences of the control signals d1 to d4 include partial sequences c1a, c1b, and c0.

TABLE 8

| CONTROL SIGNAL | CODE SEQUENCE |
| --- | --- |
| m1 | [c1a c1a c1a c1a c0 c0 c0 c0] |
| m2 | [c1b c1b c1b c1b c0 c0 c0 c0] |
| m3 | [c0 c0 c0 c0 c1a c1a c1a c1a] |
| m4 | [c0 c0 c0 c0 c1b c1b c1b c1b] |
| d1 | [c1a c0 c1a c0 c1b c0 c1b c0] |
| d2 | [c1b c0 c1b c0 c1a c0 c1a c0] |
| d3 | [c0 c1b c0 c1b c0 c1a c0 c1a] |
| d4 | [c0 c1a c0 c1a c0 c1b c0 c1b] |

In this example operation, the cycle Ts of the generated current I1 is eight times the cycle Tc of each partial sequence (e.g., c1a or c1b), and the cycle Tr of the demodulated current I3 is twice the cycle Tc of each partial sequence. That is, the frequency fr of the demodulated current I3 is four times the frequency fs of the generated current I1.

Through the above-described operations, the demodulated current I3 changes by four cycles, while the generated current I1 changes by one cycle, as illustrated in FIG. 19. That is, the demodulated current I3 having a frequency obtained by quadrupling the frequency of the generated current I1 is generated.

[2-2. Third Example Operation]

An example in which the code modulator 2 generates code-modulated power from first AC power having a first frequency, and the code demodulator 4 generates, from the code-modulated power, second AC power having a second frequency obtained by doubling the first frequency will now be described as a third example operation of the first embodiment. The third example operation, however, differs from the first example operation in the relationship between the cycle of the first AC power and the cycle of the partial sequence of a modulation code and a demodulation code.

Figure 20:
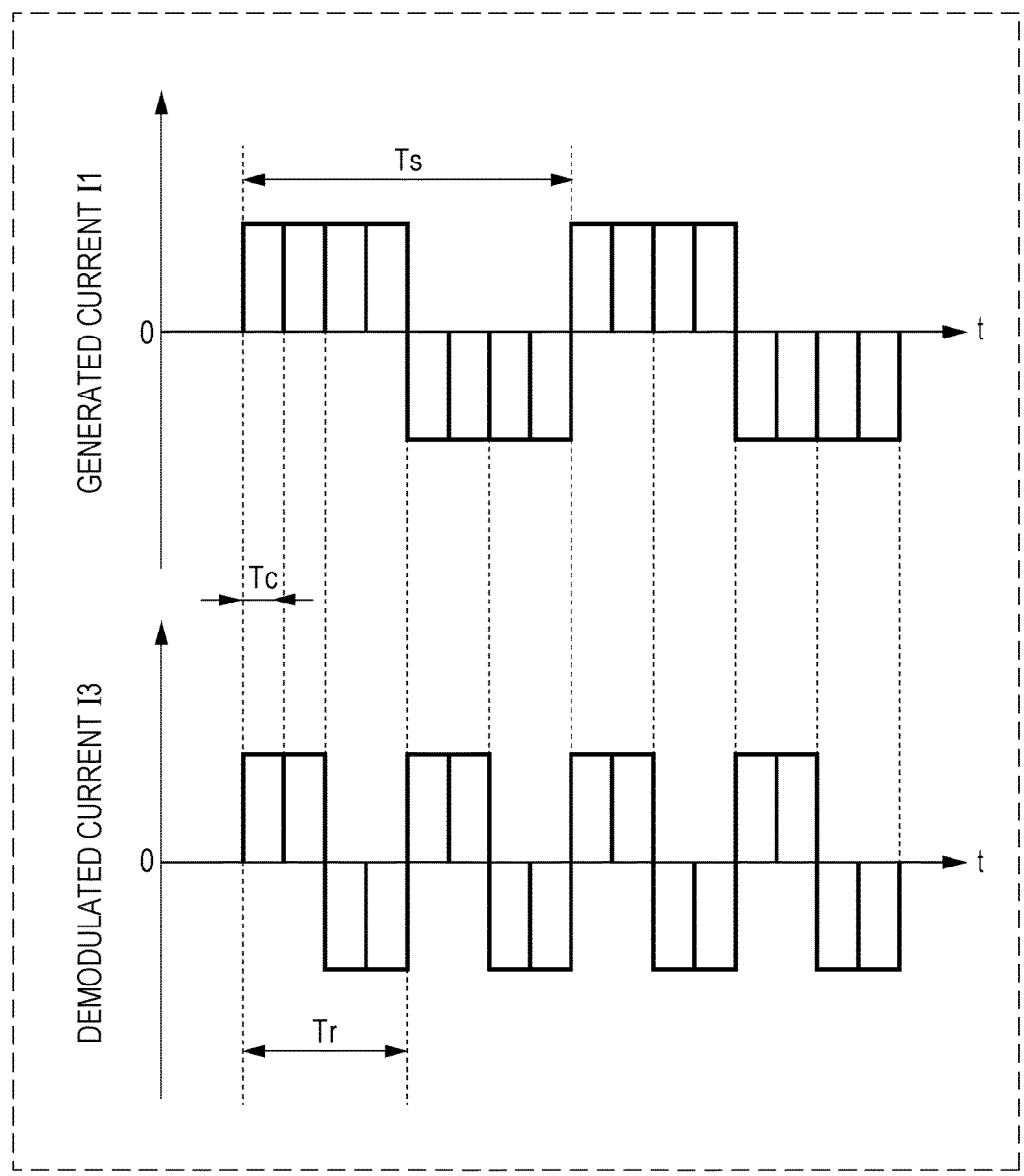
FIG. 20 is a diagram illustrating the waveforms of a generated current and a demodulated current according to a third example operation of the first embodiment.

FIG. 20 illustrates the waveforms of a generated current I1 and a demodulated current I3 according to this example operation.

The code sequences of control signals m1 to m4 input to the code modulator 2 are the same as those in Table 8. Table 9 illustrates the code sequences of control signals d1 to d4 input to the code demodulator 4 in this example operation.

TABLE 9

| CONTROL SIGNAL | CODE SEQUENCE |
| --- | --- |
| d1 | [c1a c1a c0 c0 c1b c1b c0 c0] |
| d2 | [c1b c1b c0 c0 c1a c1a c0 c0] |
| d3 | [c0 c0 c1b c1b c0 c0 c1a c1a] |
| d4 | [c0 c0 c1a c1a c0 c0 c1b c1b] |

In this example operation, the cycle Ts of the generated current I1 is eight times the cycle Tc of each partial sequence (e.g., c1a or c1b), and the cycle Tr of the demodulated current I3 is four times the cycle Tc of each partial sequence. That is, the frequency fr of the demodulated current I3 is twice the frequency fs of the generated current I1.

Through the above-described operations, the demodulated current I3 changes by two cycles, while the generated current I1 changes by one cycle, as illustrated in FIG. 20. That is, the demodulated current I3 having a frequency obtained by doubling the frequency of the generated current I1 is generated.

[2-4. Fourth Example Operation]

An example in which the code modulator 2 generates code-modulated power from first AC power having a first frequency, and the code demodulator 4 generates, from the code-modulated power, second AC power having a second frequency obtained by tripling the first frequency will now be described as a fourth example operation of the first embodiment.

Figure 21:
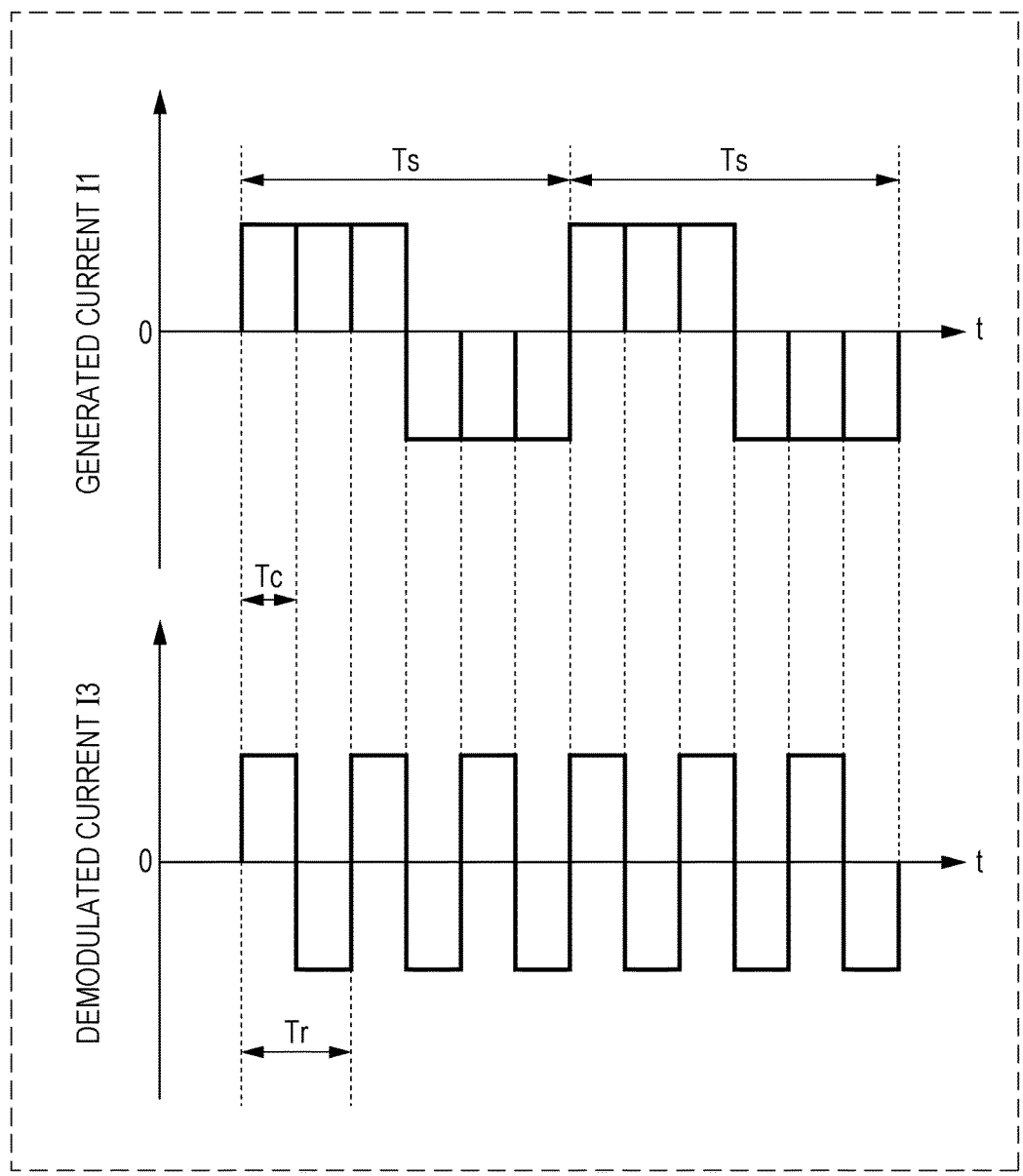
FIG. 21 is a diagram illustrating the waveforms of a generated current and a demodulated current according to a fourth example operation of the first embodiment.

FIG. 21 illustrates the waveforms of a generated current I1 and a demodulated current I3 according to this example operation.

Table 10 illustrates code sequences of control signals m1 to m4 input to the code modulator 2 and code sequences of control signals d1 to d4 input to the code demodulator 4.

TABLE 10

| CONTROL SIGNAL | CODE SEQUENCE |
| --- | --- |
| m1 | [c1a c1a c1a c0 c0 c0] |
| m2 | [c1b c1b c1b c0 c0 c0] |
| m3 | [c0 c0 c0 c1a c1a c1a] |
| m4 | [c0 c0 c0 c1b c1b c1b] |
| d1 | [c1a c0 c1a c0 c1b c0] |
| d2 | [c1b c0 c1b c0 c1a c0] |
| d3 | [c0 c1b c0 c1a c0 c1a] |
| d4 | [c0 c1a c0 c1b c0 c1b] |

In this example operation, the cycle Ts of the generated current I1 is six times the cycle Tc of each partial sequence (e.g., c1a or c1b), and the cycle Tr of the demodulated current I3 is twice the cycle Tc of each partial sequence. That is, the frequency fr of the demodulated current I3 is three times the frequency fs of the generated current I1.

Through the above-described operations, the demodulated current I3 changes by three cycles, while the generated current I1 changes by one cycle, as illustrated in FIG. 21. That is, the demodulated current I3 having a frequency obtained by tripling the frequency of the generated current I1 is generated.

[2-5. Fifth Example Operation]

An example in which the code modulator 2 generates code-modulated power from first AC power having a first frequency, and the code demodulator 4 generates, from the code-modulated power, second AC power having a second frequency obtained by multiplying the first frequency by 5 will now be described as a fifth example operation of the first embodiment.

Figure 22:
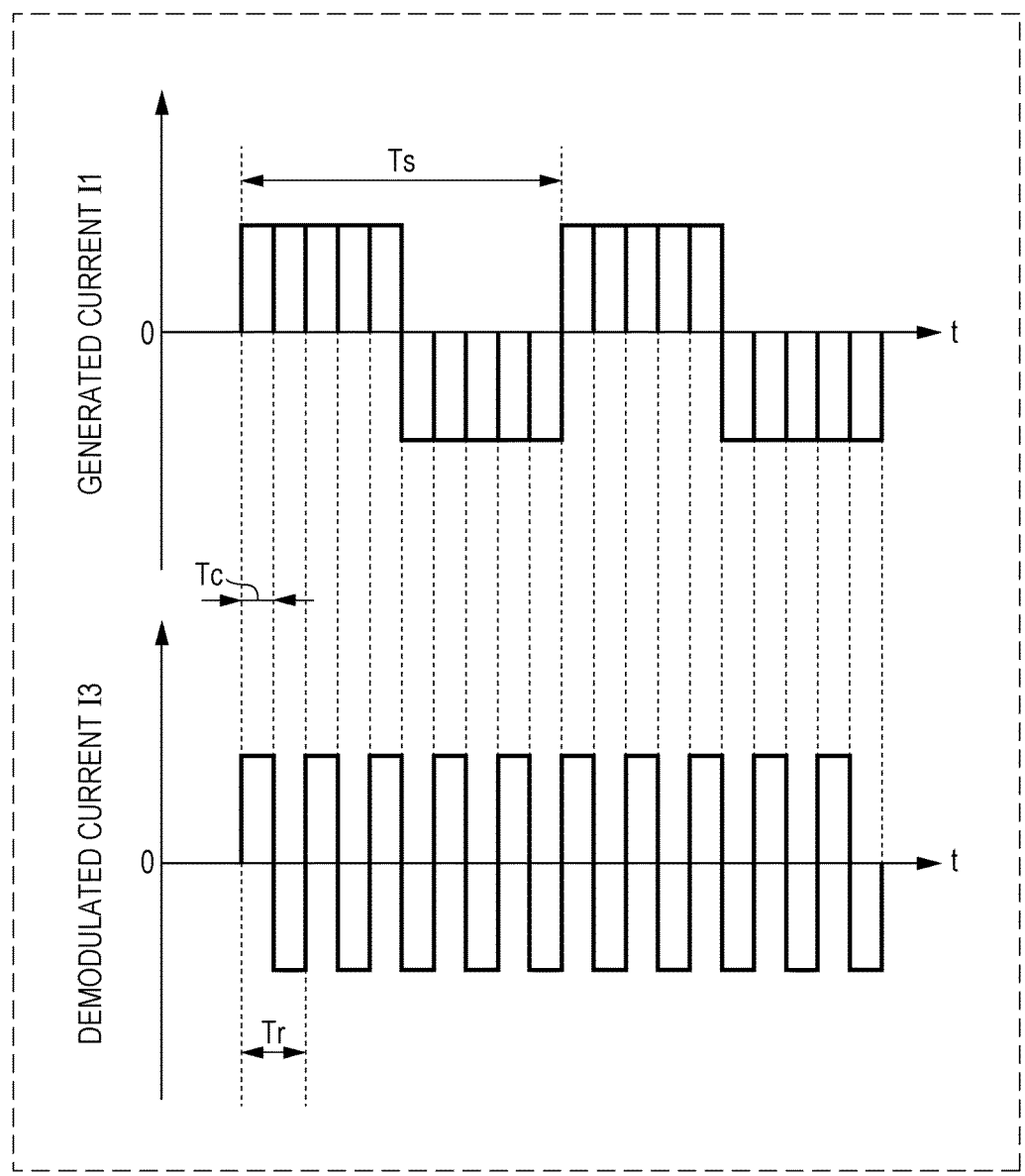
FIG. 22 is a diagram illustrating the waveforms of a generated current and a demodulated current according to a fifth example operation of the first embodiment.

FIG. 22 illustrates the waveforms of a generated current I1 and a demodulated current I3 according to this example operation.

Table 11 illustrates code sequences of control signals m1 to m4 input to the code modulator 2 and code sequences of control signals d1 to d4 input to the code demodulator 4.

TABLE 11

| CONTROL SIGNAL | CODE SEQUENCE |
| --- | --- |
| m1 | [c1a c1a c1a c1a c1a c0 c0 c0 c0 c0] |
| m2 | [c1b c1b c1b c1b c1b c0 c0 c0 c0 c0] |
| m3 | [c0 c0 c0 c0 c0 c1a c1a c1a c1a c1a] |
| m4 | [c0 c0 c0 c0 c0 c1b c1b c1b c1b c1b] |
| d1 | [c1a c0 c1a c0 c1a c0 c1b c0 c1b c0] |
| d2 | [c1b c0 c1b c0 c1b c0 c1a c0 c1a c0] |
| d3 | [c0 c1b c0 c1b c0 c1a c0 c1a c0 c1a] |
| d4 | [c0 c1a c0 c1a c0 c1b c0 c1b c0 c1b] |

In this example operation, the cycle Ts of the generated current I1 is ten times the cycle Tc of each partial sequence (e.g., c1a or c1b), and the cycle Tr of the demodulated current I3 is twice the cycle Tc of each partial sequence. That is, the frequency fr of the demodulated current I3 is five times the frequency fs of the generated current I1.

Through the above-described operations, the demodulated current I3 changes by five cycles, while the generated current I1 changes by one cycle, as illustrated in FIG. 22. That is, the demodulated current I3 having a frequency obtained by multiplying the frequency of the generated current I1 by 5 is generated.

[2-6. Supplement]

As described in the various example operations, the code demodulator according to the present embodiment can selectively generate, for example, a demodulated current I3 having a frequency that is N times (N is an integer greater than or equal to 2) of the frequency of a generated current I1. Thus, the power transmission system according to the present embodiment can multiply the frequency of the generated current I1 into a different frequency by performing code modulation and demodulation and can supply an AC having a desired frequency to the load 5.

As described in the various example operations, the code modulator according to the present embodiment may code-modulate, for example, one cycle of a generated current I1 by using a code sequence in which 2N partial sequences (N is an integer greater than or equal to 2) are coupled in tandem.

The power transmission system according to the present embodiment can also offer the advantages described above in the first and second reference modes.

[3. Modification]

The multiplication operation according to the present embodiment may be executed by, for example, the power transmission system 200 according to the fourth reference mode. For example, the code modulator 2a and the code demodulator 4a illustrated in FIG. 15 may execute any of the first to the fifth example operations described above.

In this case, the power transmission system according to the present embodiment can also offer the advantages described in the fourth reference mode.

Second Embodiment

[1. Power Transmission System]

A power transmission system according to a second embodiment is substantially the same as the power transmission system 100 described above in the second reference mode, except for details of control on the code modulator 2 and the code demodulator 4.

In the present embodiment, the code modulator 2 code-modulates first AC power having a first frequency to generate code-modulated power. In the present embodiment, the code demodulator 4 demodulates the code-modulated power to generate second AC power having a second frequency that is lower than the first frequency. In other words, the code demodulator 4 generates second AC power from the code-modulated power by using a conversion code for executing code demodulation and frequency division at a time. In the present disclosure, such a conversion code may be referred to as a "demodulation code" for simplification. The "demodulation code" described in the present embodiment is an example of a "conversion code" in the present disclosure.

The controller 10A controls the code modulator 2 and the code demodulator 4 on the basis of information about the amount and the frequency of generated power and information about the amount and the frequency of requested power.

[2. Operation]

[2-1. First Example Operation]

An example in which the code modulator 2 generates code-modulated power from first AC power having a first frequency, and the code demodulator 4 generates, from the code-modulated power, second AC power having a second frequency obtained by dividing the first frequency into ½ will now be described as a first example operation of the second embodiment.

Figure 23:
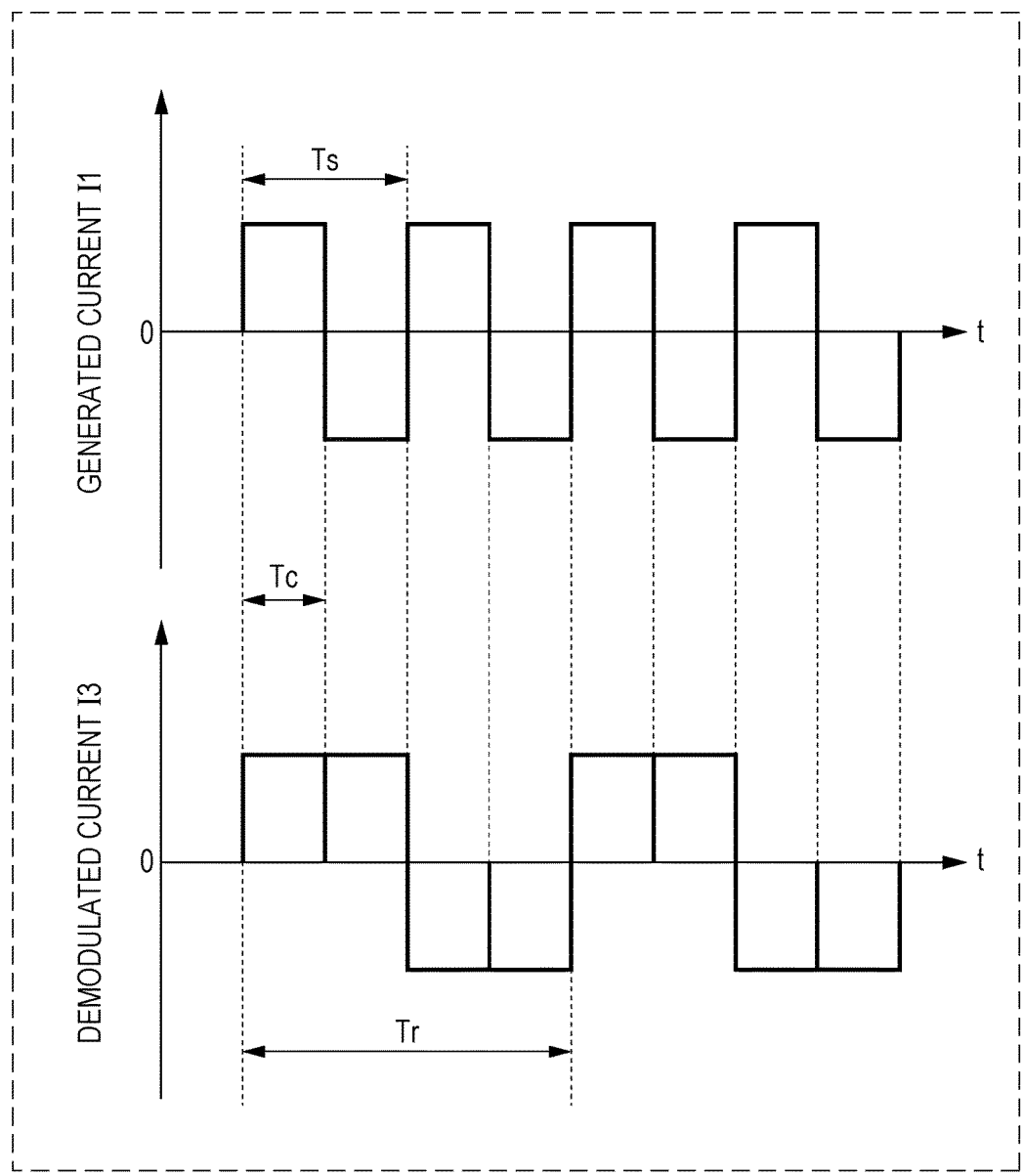
FIG. 23 is a diagram illustrating the waveforms of a generated current and a demodulated current according to a first example operation of a second embodiment.

FIG. 23 illustrates the waveforms of a generated current I1 and a demodulated current I3 according to this example operation.

In FIG. 23, the cycle of the generated current I1 is Ts [second], and the frequency thereof is fs [Hz] (=1/Ts). The cycle f the demodulated current I3 is Tr [second], and the frequency thereof is fr [Hz] (=1/Tr). Tc [second] is the cycle of each partial sequence (described below) included in a modulation code and a demodulation code.

Table 12 illustrates code sequences of control signals m1 to m4 input to the code modulator 2 and code sequences of control signals d1 to d4 input to the code demodulator 4. The code sequences of the control signals m1 to m4 and the code sequences of the control signals d1 to d4 include partial sequences c1$a$, c1$b$, and c0. The partial sequences c1$a$ and c1$b$ are orthogonal code sequences as illustrated in Table 1 described above, and the partial sequence c0 is a zero sequence.

TABLE 12

| CONTROL SIGNAL | CODE SEQUENCE |
| --- | --- |
| m1 | [c1a c0 c1b c0] |
| m2 | [c1b c0 c1a c0] |
| m3 | [c0 c1b c0 c1a] |
| m4 | [c0 c1a c0 c1b] |
| d1 | [c1a c1a c0 c0] |
| d2 | [c1b c1b c0 c0] |
| d3 | [c0 c0 c1a c1a] |
| d4 | [c0 c0 c1b c1b] |

In this example operation, the cycle Tc illustrated in FIG. 23 corresponds to the duration of each of the partial sequences c1$a$ and c1$b$. In FIG. 23, the cycle Ts of the generated current I1 is twice the cycle Tc of each partial sequence, and the cycle Tr of the demodulated current I3 is four times the cycle Tc of each partial sequence. That is, the cycle Tr of the demodulated current I3 is twice the cycle Ts of the generated current I1. In other words, the frequency fr of the demodulated current I3 is one-half of the frequency fs of the generated current I1.

The series of switching operations based on the control signals m1 to m4 illustrated in Table 12 corresponds to an operation for code-modulating the generated current I1 with a modulation code Md below. Also, the series of switching operations based on the control signals d1 to d4 illustrated in Table 12 corresponds to an operation for code-demodulating the modulated current I2 with a demodulation code Dd below.

$Md$=[C1 C2 C2 C1]

$Dd$=[C1 C1 C1 C1]

$C1$=[1 −1 1 1 1 −1 −1], $C2$=[−1 1 −1 −1 −1 1 1] (9)

As illustrated in Table 12, in the first half of a first cycle of the generated current I1, the control signals m1 to m4 input to the code modulator 2 and the control signals d1 to d4 input to the code demodulator 4 match each other. In other words, in the first half of the first cycle, the partial sequence C1 in the modulation code Md and the partial sequence C1 in the demodulation code Dd match each other. Thus, in the first half of the first cycle, a positive generated current I1 is restored as a positive demodulated current I3.

As illustrated in Table 12, in the last half of the first cycle of the generated current I1, the control signals m1 to m4 input to the code modulator 2 and the control signals d1 to d4 input to the code demodulator 4 differ from each other. However, in the last half of the first cycle, the bit values of the partial sequence C1 in the demodulation code Dd correspond to values obtained by inverting the corresponding bit values of the partial sequence C2 in the modulation code Md. Thus, in the last-half of the first cycle, a negative generated current I1 is converted into a positive demodulated current I3.

As illustrated in Table 12, in the first half of a second cycle of the generated current I1, the control signals m1 to m4 input to the code modulator 2 and the control signals d1 to d4 input to the code demodulator 4 differ from each other. However, in the first half of the second cycle, the bit values of the partial sequence C1 in the demodulation code Dd correspond to values obtained by inverting the corresponding bit values of the partial sequence C2 in the modulation code Md. Thus, in the first half of the second cycle, a positive generated current I1 is converted into a negative demodulated current I3.

As illustrated in Table 12, in the last half of the second cycle of the generated current I1, the control signals m1 to m4 input to the code modulator 2 and the control signals d1 to d4 input to the code demodulator 4 match each other. In other words, in the last half of the second cycle, the partial sequence C1 in the modulation code Md and the partial sequence C1 in the demodulation code Dd match each other. Thus, in the last half of the second cycle, a negative generated current I1 is restored as a negative demodulated current I3.

Through the above-described operations, the demodulated current I3 changes by one cycle, while the generated current I1 changes by two cycles, as illustrated in FIG. 23. That is, the demodulated current I3 having a frequency obtained by dividing the frequency of the generated current I1 into ½ is generated.

In the present embodiment, of the partial sequences that constitute a demodulation code, a partial sequence in which individual bit values of the demodulation code take the same values as corresponding bit values of the modulation code may be referred to as a "first partial sequence". Of partial sequences that constitute a demodulation code, a partial sequence in which individual bit values of the demodulation code take values obtained by inverting corresponding bit values of the modulation code may be referred to as a "second partial sequence". In the demodulation code in this example operation, the partial sequence C1 in the first half of the first cycle of the generated current and the partial sequence C1 in the last half of the second cycle each correspond to the first partial sequence, and the partial sequence C1 in the last half of the first cycle of the generated current and the partial sequence C1 in the first half of the second cycle each correspond to the second partial sequence.

[2-2. Second Example Operation]

An example in which the code modulator 2 generates code-modulated power from first AC power having a first frequency, and the code demodulator 4 generates, from the code-modulated power, second AC power having a second frequency obtained by dividing the first frequency into ¼ will now be described as a second example operation of the second embodiment.

Figure 24:
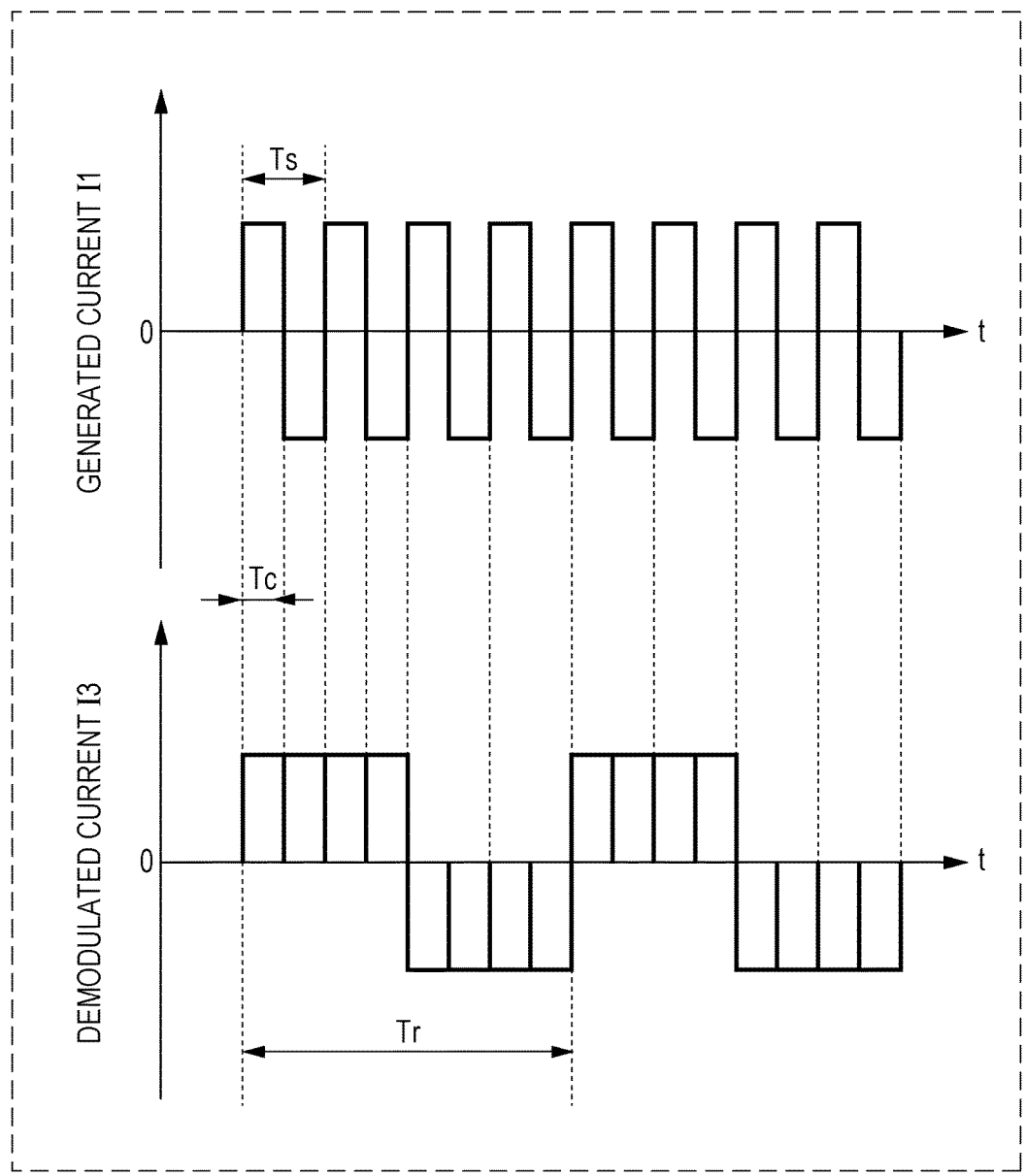
FIG. 24 is a diagram illustrating the waveforms of a generated current and a demodulated current according to a second example operation of the second embodiment.

FIG. 24 illustrates the waveforms of a generated current I1 and a demodulated current I3 according to this example operation.

Table 13 illustrates code sequences of control signals m1 to m4 input to the code modulator 2 and code sequences of control signals d1 to d4 input to the code demodulator 4. The code sequences of the control signals m1 to m4 and the code sequences of the control signals d1 to d4 include partial sequences c1a, c1b, and c0.

TABLE 13

| CONTROL SIGNAL | CODE SEQUENCE |
| --- | --- |
| m1 | [c1a c0 c1a c0 c1b c0 c1b c0] |
| m2 | [c1b c0 c1b c0 c1a c0 c1a c0] |
| m3 | [c0 c1b c0 c1b c0 c1a c0 c1a] |
| m4 | [c0 c1a c0 c1a c0 c1b c0 c1b] |
| d1 | [c1a c1a c1a c1a c0 c0 c0 c0] |
| d2 | [c1b c1b c1b c1b c0 c0 c0 c0] |
| d3 | [c0 c0 c0 c0 c1a c1a c1a c1a] |
| d4 | [c0 c0 c0 c0 c1b c1b c1b c1b] |

In this example operation, the cycle Tr of the demodulated current I3 is eight times the cycle Tc of each partial sequence (e.g., c1a or c1b), and the cycle Ts of the generated current I1 is twice the cycle Tc of each partial sequence. That is, the frequency fr of the demodulated current I3 is one-fourth of the frequency fs of the generated current I1.

Through the above-described operations, the demodulated current I3 changes by one cycle, while the generated current I1 changes by four cycles, as illustrated in FIG. 24. That is, the demodulated current I3 having a frequency obtained by dividing the frequency of the generated current I1 into ¼ is generated.

[2-3. Third Example Operation]

An example in which the code modulator 2 generates code-modulated power from first AC power having a first frequency, and the code demodulator 4 generates, from the code-modulated power, second AC power having a second frequency obtained by dividing the first frequency into ½ will now be described as a third example operation of the second embodiment. The third example operation, however, differs from the first example operation in the relationship between the cycle of the first AC power and the cycle of the partial sequence of a modulation code and a demodulation code.

Figure 25:
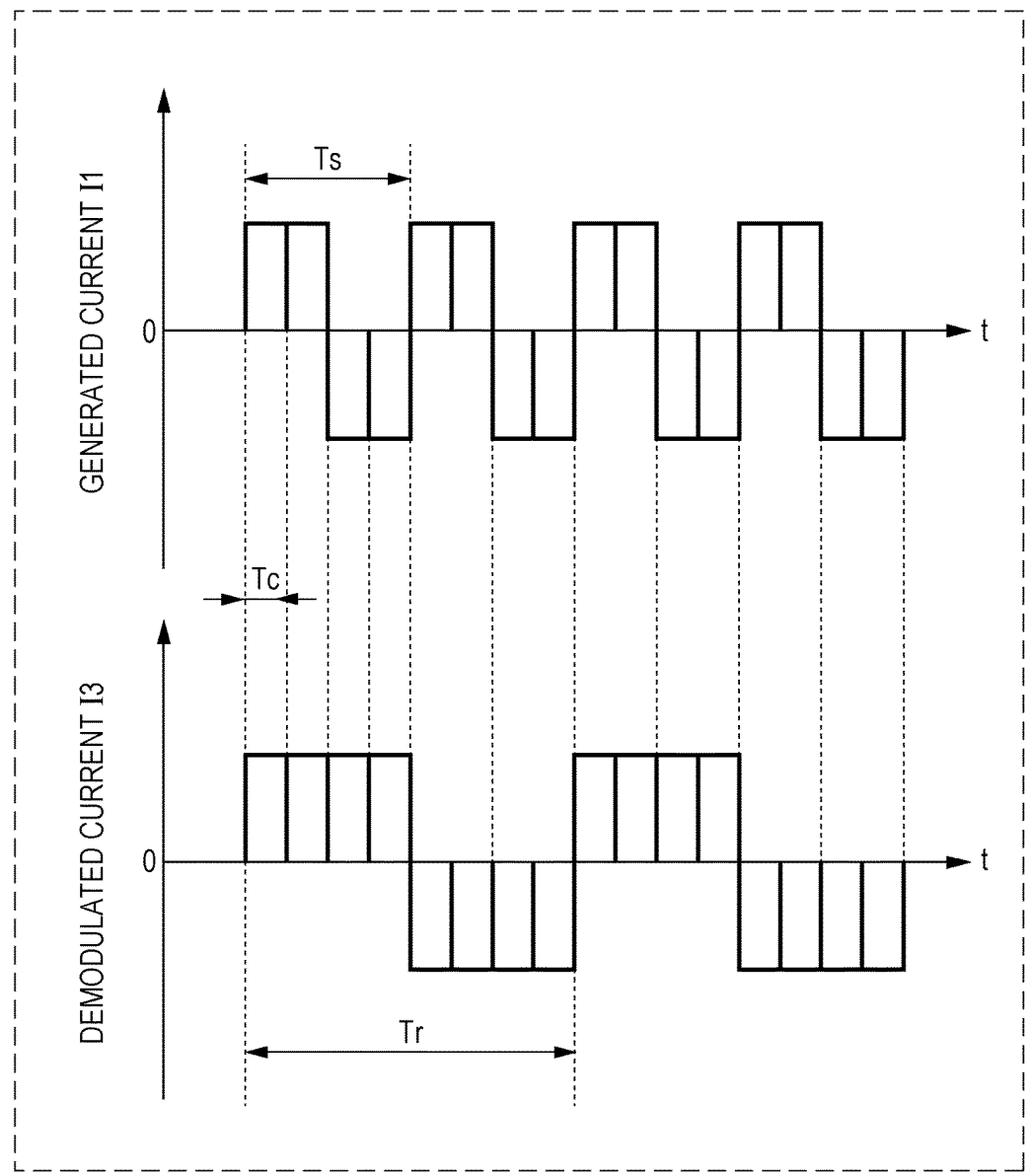
FIG. 25 is a diagram illustrating the waveforms of a generated current and a demodulated current according to a third example operation of the second embodiment.

FIG. 25 illustrates the waveforms of a generated current I1 and a demodulated current I3 according to this example operation.

Table 14 illustrates code sequences of control signals m1 to m4 input to the code modulator 2 in this example operation. Code sequences of control signals d1 to d4 input to the code demodulator 4 are the same as those in Table 13 described above.

TABLE 14

| CONTROL SIGNAL | CODE SEQUENCE |
| --- | --- |
| m1 | [c1a c1a c0 c0 c1b c1b c0 c0] |
| m2 | [c1b c1b c0 c0 c1a c1a c0 c0] |
| m3 | [c0 c0 c1b c1b c0 c0 c1a c1a] |
| m4 | [c0 c0 c1a c1a c0 c0 c1b c1b] |

In this example operation, the cycle Ts of the generated current I1 is four times the cycle Tc of each partial sequence (e.g., c1a or c1b), and the cycle Tr of the demodulated current I3 is eight times the cycle Tc of each partial sequence. That is, the frequency fr of the demodulated current I3 is one-half of the frequency fs of the generated current I1.

Through the above-described operations, the demodulated current I3 changes by one cycle, while the generated current I1 changes by two cycles, as illustrated in FIG. 25. That is, the demodulated current I3 having a frequency obtained by dividing the frequency of the generated current I1 into ½ is generated.

[2-4. Fourth Example Operation]

An example in which the code modulator 2 generates code-modulated power from first AC power having a first frequency, and the code demodulator 4 generates, from the code-modulated power, second AC power having a second frequency obtained by dividing the first frequency into ⅓ will now be described as a fourth example operation of the second embodiment.

Figure 26:
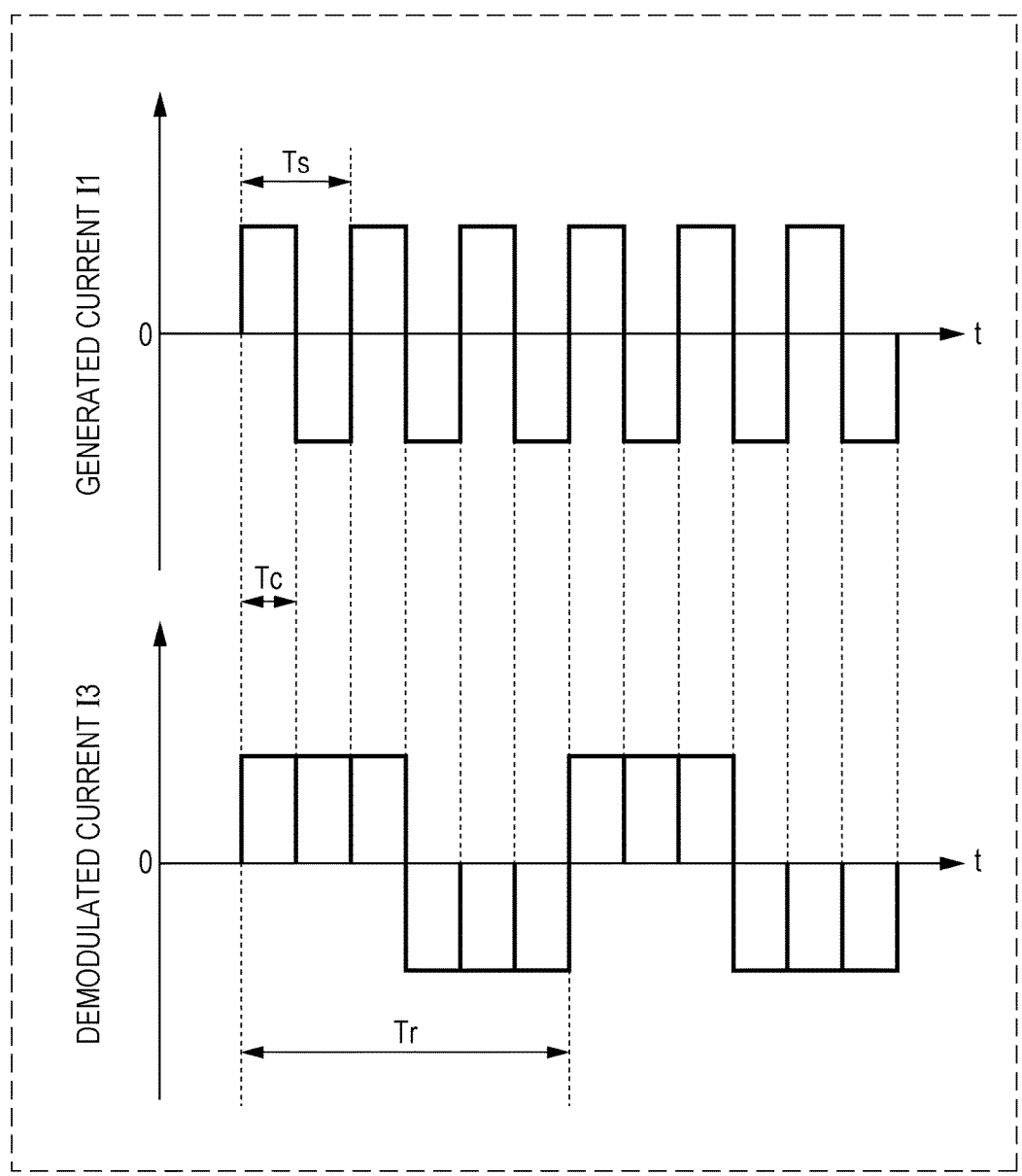
FIG. 26 is a diagram illustrating the waveforms of a generated current and a demodulated current according to a fourth example operation of the second embodiment.

FIG. 26 illustrates the waveforms of a generated current I1 and a demodulated current I3 according to this example operation.

Table 15 illustrates code sequences of control signals m1 to m4 input to the code modulator 2 and code sequences of control signals d1 to d4 input to the code demodulator 4.

TABLE 15

| CONTROL SIGNAL | CODE SEQUENCE |
| --- | --- |
| m1 | [c1a c0 c1a c0 c1b c0] |
| m2 | [c1b c0 c1b c0 c1a c0] |
| m3 | [c0 c1b c0 c1a c0 c1a] |
| m4 | [c0 c1a c0 c1b c0 c1b] |
| d1 | [c1a c1a c1a c0 c0 c0] |
| d2 | [c1b c1b c1b c0 c0 c0] |
| d3 | [c0 c0 c0 c1a c1a c1a] |
| d4 | [c0 c0 c0 c1b c1b c1b] |

In this example operation, the cycle Ts of the generated current I1 is twice the cycle Tc of each partial sequence (e.g., c1a or c1b), and the cycle Tr of the demodulated current I3 is six times the cycle Tc of each partial sequence. That is, the frequency fr of the demodulated current I3 is one-third of the frequency fs of the generated current I1.

Through the above-described operations, the demodulated current I3 changes by one cycle, while the generated current I1 changes by three cycles, as illustrated in FIG. 26. That is, the demodulated current I3 having a frequency obtained by dividing the frequency of the generated current I1 into ⅓ is generated.

[2-5. Fifth Example Operation]

An example in which the code modulator 2 generates code-modulated power from first AC power having a first frequency, and the code demodulator 4 generates, from the code-modulated power, second AC power having a second frequency obtained by dividing the first frequency into ⅕ will now be described as a fifth example operation of the second embodiment.

Figure 27:
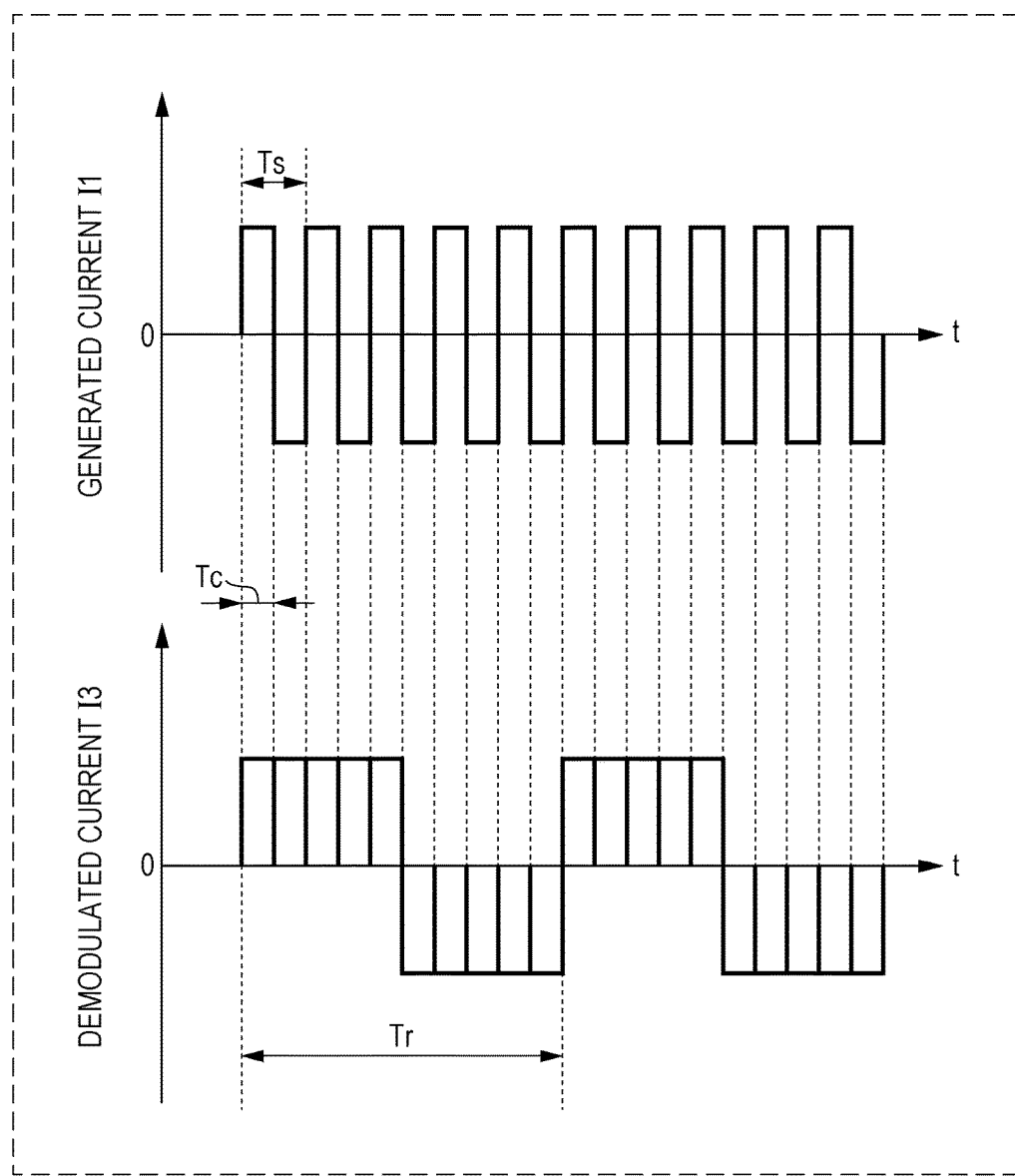
FIG. 27 is a diagram illustrating the waveforms of a generated current and a demodulated current according to a fifth example operation of the second embodiment.

FIG. 27 illustrates the waveforms of a generated current I1 and a demodulated current I3 according to this example operation.

Table 16 illustrates code sequences of control signals m1 to m4 input to the code modulator 2 and code sequences of control signals d1 to d4 input to the code demodulator 4.

TABLE 16

| CONTROL SIGNAL | CODE SEQUENCE |
| --- | --- |
| m1 | [c1a c0 c1a c0 c1a c0 c1b c0 c1b c0] |
| m2 | [c1b c0 c1b c0 c1b c0 c1a c0 c1a c0] |

TABLE 16-continued

| CONTROL SIGNAL | CODE SEQUENCE |
| --- | --- |
| m3 | [c0 c1b c0 c1b c0 c1a c0 c1a c0 c1a] |
| m4 | [c0 c1a c0 c1a c0 c1b c0 c1b c0 c1b] |
| d1 | [c1a c1a c1a c1a c1a c0 c0 c0 c0 c0] |
| d2 | [c1b c1b c1b c1b c1b c0 c0 c0 c0 c0] |
| d3 | [c0 c0 c0 c0 c1a c1a c1a c1a c1a] |
| d4 | [c0 c0 c0 c0 c1b c1b c1b c1b c1b] |

In this example operation, the cycle Ts of the generated current I1 is twice the cycle Tc of each partial sequence (e.g., c1a or c1b), and the cycle Tr of the demodulated current I3 is ten times the cycle Tc of each partial sequence. That is, the frequency fr of the demodulated current I3 is one-fifth of the frequency fs of the generated current I1.

Through the above-described operations, the demodulated current I3 changes by one cycle, while the generated current I1 changes by five cycles, as illustrated in FIG. 27. That is, the demodulated current I3 having a frequency obtained by dividing the frequency of the generated current I1 into 1/5 is generated.

[2-6. Supplement]

As described in the various example operations, the code demodulator according to the present embodiment can selectively generate, for example, a demodulated current I3 having a frequency that is 1/N (N is an integer greater than or equal to 2) of the frequency of a generated current I1. Accordingly, the power transmission system according to the present embodiment can divide the frequency of the generated current I1 into a different frequency by performing the code modulation and demodulation and can supply an AC having a desired frequency to the load 5.

The power transmission system according to the present embodiment can also offer the advantages described above in the first and second reference modes.

[3. Modification]

The division operation according to the present embodiment may be executed by, for example, the power transmission system 200 according to the fourth reference mode. For example, the code modulator 2a and the code demodulator 4a illustrated in FIG. 15 may execute any of the first to fifth example operations described above.

In this case, the power transmission system according to the present embodiment can also offer the advantages described in the fourth reference mode.

Other Embodiments

The present disclosure is not limited to the specific examples in the reference modes and embodiments described above. The disclosed technology is not limited to the specific examples described above in the various reference modes and embodiments and also encompasses any modes obtained by performing a change, replacement, addition, and omission to those embodiments, as appropriate. The present disclosure further encompasses a combination of at least two of the reference modes and the embodiments.

The various waveforms exemplified above in the first and second embodiments are schematic waveforms. An actual current waveform may have a different shape, for example, depending on loss.

Although, in the first to fourth reference modes and the first and second embodiments, the code sequence of the control signals, the code sequence of the modulation code, the code sequence of the demodulation code, and the code sequence of the conversion code each include one or more orthogonal Gold sequences, the present disclosure is not limited thereto. For example, the modulation code, the demodulation code, and/or the conversion code may be other orthogonal codes. Examples of the other orthogonal codes include an m sequence.

Although, in the first to fourth reference modes and the first and second embodiments, each code length of the control signals, the modulation code, the demodulation code and the conversion code is 7 bits or 14 bits, the present disclosure is not limited thereto. The larger the code length, the larger the number of an orthogonal code that can be generated. Also, when the code length is increased, the correlation decreases to thereby make it possible to more accurately split power.

In the first and second embodiments, the code modulator and the code demodulator may be the circuits illustrated in FIGS. 9 and 10 or may be the circuits illustrated in FIGS. 11 and 12.

The code demodulator and/or the code modulator exemplified above in each of the first to fourth reference modes and the first and second embodiments may be used in any power transmission system and are/is not limited to a particular system.

Although, in each of the first to fourth reference modes and the first and second embodiments, the controller has been described as being located external to the code modulator and the code demodulator, the present disclosure is not limited thereto. At least one of the functions of the controller may be incorporated into at least one of the code modulator and the code demodulator.

Although an example in which the current is code-modulated and code-demodulated has been described in each of the first to fourth reference modes and the first and second embodiments, the voltage may be code-modulated and code-demodulated, or the current and the voltage may be modulated and demodulated.

Overview of Embodiments

A power receiving apparatus according to a first aspect is a power receiving apparatus that receives, through a transmission path, an AC code-modulated wave including first power from a power transmitting apparatus that generates the AC code-modulated wave by code-modulating the first power through use of a predetermined modulation code having a modulation code frequency higher than a frequency of the first power, the power receiving apparatus including: a code demodulator that converts the received AC code-modulated wave into second power by code-demodulating, through use of a predetermined demodulation code having a demodulation code frequency higher than a frequency of the second power, the AC code-modulated wave so that a frequency of the second power after the code demodulation is lower than the frequency of the first power and that outputs the second power.

A power receiving apparatus according to a second aspect has a feature that, in the power receiving apparatus according to the first aspect, the demodulation code is a predetermined orthogonal code.

A power transmission system according to a third aspect includes: at least one of the power transmitting apparatuses; and at least one of the power receiving apparatuses according to the first or second aspect, wherein the modulation code is the same as the demodulation code.

A power transmission system according to a fourth aspect has a feature that, in the power transmission system according to the third aspect, the first power is at least one of DC power and AC power, and the second power is at least one of DC power and AC power.

A power transmission system according to a fifth aspect has a feature that, in the power transmission system according to the third or fourth aspect, instead of transmitting power from the power transmitting apparatus to the power receiving apparatus in a forward direction, the code modulator in the power transmitting apparatus is used as a code demodulator, and the code demodulator in the power receiving apparatus is used as a code modulator to thereby transmit power in an opposite direction.

A power transmission system according to a sixth aspect has a feature that, in the power transmission system according to one of the third to fifth aspects, the code modulator includes a first generation circuit that generates the modulation code, and the code demodulator includes a second generation circuit that generates the demodulation code.

A power transmission system according to a seventh aspect has a feature that, in the power transmission system according to the sixth aspect, the power transmission system includes a controller that controls the power transmission system, the controller outputs, to the code modulator, a modulation start time, a modulation end time, and a control signal for generating the modulation code, the controller outputs, to the code demodulator, a demodulation start time, a demodulation end time, and a control signal for generating the demodulation code, the code modulator code-modulates the first power, based on the modulation start time, the modulation end time, and the control signal for generating the modulation code, and the code demodulator code-demodulates the first power into the second power, based on the demodulation start time, the demodulation end time, and the control signal for generating the demodulation code.

A power transmission system according to an eighth aspect has a feature that, in the power transmission system according to the seventh aspect, the power transmitting apparatus includes first power measuring means that measures an amount of the first power, and the power receiving apparatus includes second power measuring means that measures an amount of the second power.

A power transmission system according to a ninth aspect has a feature that, in the power transmission system according to the eighth aspect, the power transmission system includes a plurality of code modulators and a plurality of code demodulators, and based on the amount of the first power measured by the first power measuring means and the amount of the second power measured by the second power measuring means, the controller controls operations of the plurality of code modulators and the plurality of code demodulators, to thereby flexibly transmit power between a power channel of the plurality of code modulators and a power channel of the plurality of code demodulators.

According to the present disclosure, in the power transmission system, combinations of electric generators, which serve as power transmission sources, and power loads, which serve as power transmission destinations, and amounts of power to be flexibly transmitted are actively specified, and then flexible power transmission can be concurrently and independently performed between the combinations through one power transmission path.

The power transmission system according to the present disclosure is useful for power transmission from an electric generator, such as a photovoltaic generator, a wind power generator, or a hydroelectric power generator to a train or an electric vehicle (EV).

What is claimed is:
1. A converter comprising:
a terminal that receives code-modulated power into which first alternating-current power has been code-modulated with a modulation code, the first alternating-current power having a first frequency; and
a circuit that converts the code-modulated power with a conversion code to generate second alternating-current power having a second frequency lower than the first frequency,
wherein the conversion code includes:
 a first partial sequence, of which bit values are respectively the same as corresponding bit values of the modulation code;
 a second partial sequence, of which bit values are respectively the same as values obtained by inverting corresponding bit values of the modulation code;
 a third partial sequence, of which bit values are respectively the same as values obtained by inverting corresponding bit values of the modulation code; and
 a fourth partial sequence, of which bit values are respectively the same as corresponding bit values of the modulation code, and
wherein the circuit converts the code-modulated power into the second alternating-current power by performing code demodulation that includes:
 in a first period, code-demodulating the code-modulated power with the first partial sequence to generate a first positive current;
 in a second period, invertedly code-demodulating the code-modulated power with the second partial sequence to generate a second positive current;
 in a third period, invertedly code-demodulating the code-modulated power with the third partial sequence to generate a first negative current; and
 in a fourth period, code-demodulating the code-modulated power with the fourth partial sequence to generate a second negative current.
2. The converter according to claim 1,
wherein each cycle of the first partial sequence, the second partial sequence, the third partial sequence, and the fourth partial sequence is one-fourth or less of a cycle of the second alternating-current power.
3. The converter according to claim 1,
wherein each of the first partial sequence, the second partial sequence, the third partial sequence, and the fourth partial sequence is an orthogonal code sequence.
4. The converter according to claim 3,
the orthogonal code sequence is an orthogonal Gold sequence or an orthogonal m-sequence.
5. The converter according to claim 1,
wherein the second frequency of the second alternating-current power is one-Nth of the first frequency of the first alternating-current power, where N is an integer greater than or equal to 2.
6. The converter according to claim 5,
wherein the conversion code includes 2N partial sequences including the first partial sequence, the second partial sequence, the third partial sequence, and the fourth partial sequence, and
the 2N partial sequences have the same code length.
7. The converter according to claim 1,
wherein the circuit comprises a plurality of switches.
8. The converter according to claim 7, further comprising:
a control circuit that generates control signals for turning on and off the switches, wherein the circuit converts the code-modulated power in accordance with the control signals.

9. The converter according to claim 8, further comprising:
a communication circuit that receives, from a controller, an instruction signal that includes timing information indicating a timing at which the code-modulated power is to be converted and code information regarding the conversion code, and
the control circuit generates the control signals in accordance with the instruction signal.

10. The converter according to claim 1,
wherein the circuit comprises an H-bridge circuit in which four bidirectional switch circuits are connected in a full-bridge configuration.

11. A power transmission system comprising:
the converter according to claim 1; and
a code modulator that code-modulates the first alternating-current power with the modulation code to generate the code-modulated power.

12. The converter according to claim 1,
wherein the code-modulated power is power of which current direction and/or voltage polarity changes at periods each corresponding to an integer multiple of a unit period.

13. The converter according to claim 1,
wherein the first partial sequence, the second partial sequence, the third partial sequence, and the fourth partial sequence have the same code length.

14. The converter according to claim 1,
wherein each cycle of the first partial sequence, the second partial sequence, the third partial sequence, and the fourth partial sequence is equal to a half cycle of the first alternating-current power.

15. The converter according to claim 1,
wherein the third partial sequence is the same sequence as the second partial sequence, and the fourth partial sequence is the same sequence as the first partial sequence.

16. The converter according to claim 1,
wherein the second positive current is the same current as the first positive current, and the second negative current is the same current as the first negative current.

17. The power transmission system according to claim 11, further comprising:
a controller including a processor and a communication circuit; and
a transmission path through which the code modulator and the converter are connected to each other,
wherein the processor:
generates a first instruction signal for code-modulating the first alternating-current power with the modulation code to generate the code-modulated power;
transmits the first instruction signal to the code modulator via the communication circuit;
generates a second instruction signal for converting the code-modulated power with the conversion code to generate the second alternating-current power; and
transmits the second instruction signal to the converter via the communication circuit.

* * * * *